(12) United States Patent
Sakamoto et al.

(10) Patent No.: US 9,984,754 B2
(45) Date of Patent: May 29, 2018

(54) MEMORY DEVICE AND METHOD FOR OPERATING THE SAME

(71) Applicant: TOSHIBA MEMORY CORPORATION, Minato-ku (JP)

(72) Inventors: Wataru Sakamoto, Yokkaichi (JP); Fumitaka Arai, Yokkaichi (JP); Tatsuya Kato, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 14/645,708

(22) Filed: Mar. 12, 2015

(65) Prior Publication Data

US 2016/0093382 A1 Mar. 31, 2016

Related U.S. Application Data

(60) Provisional application No. 62/056,640, filed on Sep. 29, 2014.

(51) Int. Cl.
| | | |
|---|---|---|
| *G11C 16/10* | (2006.01) | |
| *G11C 16/04* | (2006.01) | |
| *H01L 27/115* | (2017.01) | |
| *G11C 11/56* | (2006.01) | |
| *H01L 27/11524* | (2017.01) | |
| *H01L 27/11556* | (2017.01) | |

(52) U.S. Cl.
CPC .......... *G11C 16/10* (2013.01); *G11C 11/5628* (2013.01); *G11C 16/0483* (2013.01); *H01L 27/115* (2013.01); *H01L 27/11524* (2013.01); *H01L 27/11556* (2013.01); *G11C 2211/5621* (2013.01)

(58) Field of Classification Search
CPC ............................ G11C 16/10; G11C 11/5628
USPC ..................................... 365/185.19
See application file for complete search history.

(56) References Cited

U.S. PATENT DOCUMENTS

| | | | |
|---|---|---|---|
| 2007/0252201 A1* | 11/2007 | Kito | ............ H01L 21/8221 257/331 |
| 2010/0044778 A1* | 2/2010 | Seol | ............ H01L 21/28273 257/326 |
| 2010/0238725 A1 | 9/2010 | Naruke | |
| 2011/0199804 A1 | 8/2011 | Son et al. | |
| 2012/0001247 A1* | 1/2012 | Alsmeier | .......... H01L 27/11551 257/316 |
| 2013/0094292 A1* | 4/2013 | Park | ............ G11C 11/5628 365/185.03 |
| 2013/0235666 A1 | 9/2013 | Sakamoto et al. | |
| 2013/0248965 A1 | 9/2013 | Nakai et al. | |

(Continued)

FOREIGN PATENT DOCUMENTS

WO   WO 2015/105049 A2   7/2015

*Primary Examiner* — Hoai V Ho
*Assistant Examiner* — Muna A Techane
(74) *Attorney, Agent, or Firm* — Oblon, McClelland, Maier & Neustadt, L.L.P.

(57) ABSTRACT

According to an embodiment, an operation method for a memory device which has a first memory element and a second memory element respectively provided on both sides of a semiconductor member includes applying a first potential on the second word line to write a second data to the second memory and applying a second potential on the first word line to write the first data to the first memory. The first potential increases by a first step voltage and the second potential increases by a second step voltage.

19 Claims, 28 Drawing Sheets

(56) References Cited

U.S. PATENT DOCUMENTS

2013/0294155 A1* 11/2013 Chen ................. G11C 16/0483
       365/185.02
2014/0085983 A1*  3/2014 Hosono ............. G11C 16/0408
       365/185.17
2015/0200199 A1   7/2015 Sakamoto et al.

* cited by examiner

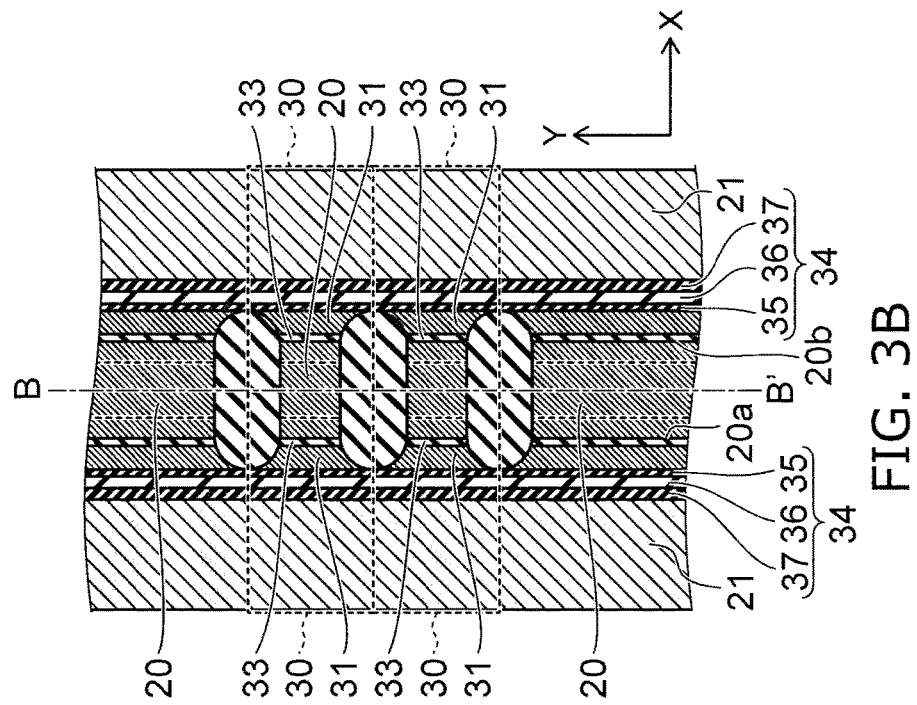
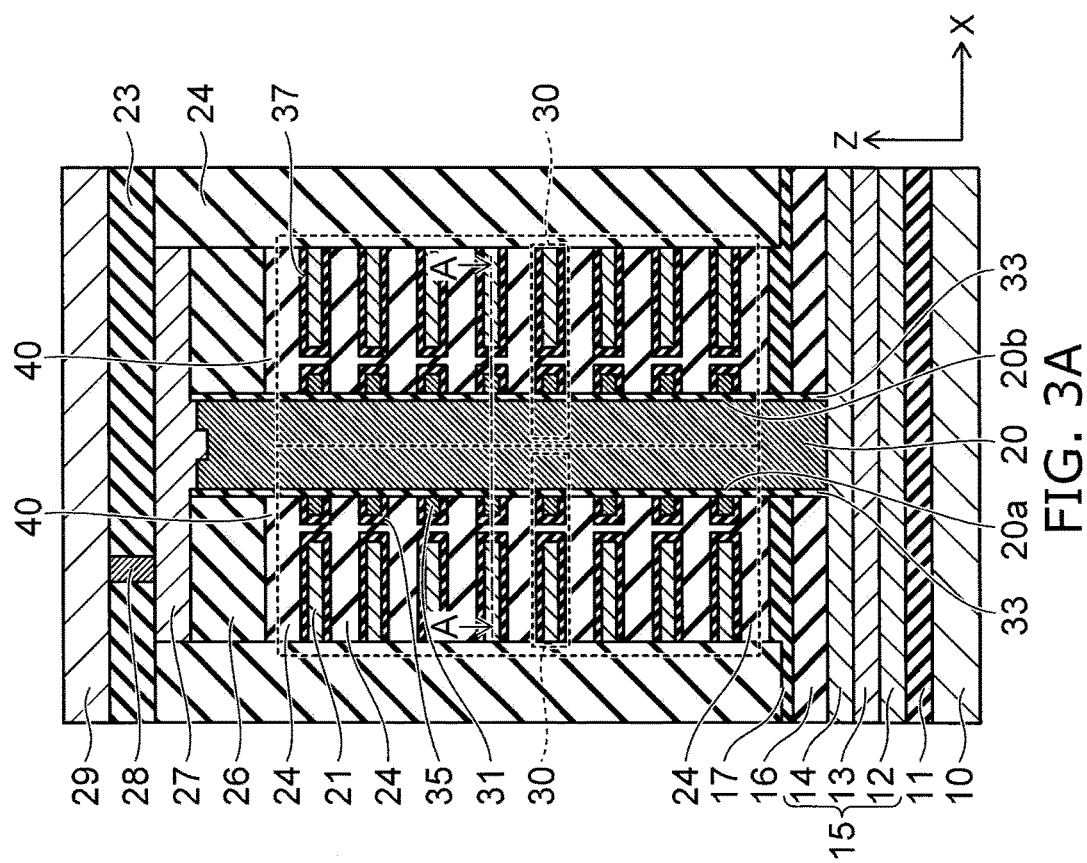
FIG. 3A
FIG. 3B

|  | M0 | M1 | M2 | M3 | M4 | M5 | M6 | M7 |
|---|---|---|---|---|---|---|---|---|
| Initial | Fine | Fine | Fine | Fine | Fine | Fine | Fine | Fine |
| M1 Rough (2) | Fine | Rough | Fine | Fine | Fine | Fine | Fine | Fine |
| M2 Rough (3) | Fine | Rough | Rough | Fine | Fine | Fine | Fine | Fine |
| M0 Fine (4) | Fine | Rough | Rough | Fine | Fine | Fine | Fine | Fine |
| M3 Rough (5) | Fine | Rough | Rough | Rough | Fine | Fine | Fine | Fine |
| M1 Fine (5) | Fine | Fine | Rough | Rough | Fine | Fine | Fine | Fine |
| M4 Rough (6) | Fine | Fine | Rough | Rough | Rough | Fine | Fine | Fine |
| M2 Fine (6) | Fine | Fine | Fine | Rough | Rough | Fine | Fine | Fine |
| M5 Rough (7) | Fine | Fine | Fine | Rough | Rough | Rough | Fine | Fine |
| M3 Fine (7) | Fine | Fine | Fine | Fine | Rough | Rough | Fine | Fine |
| M6 Rough (8) | Fine | Fine | Fine | Fine | Rough | Rough | Rough | Fine |
| M4 Fine (8) | Fine | Fine | Fine | Fine | Fine | Rough | Rough | Fine |
| M7 Rough (9) | Fine | Fine | Fine | Fine | Fine | Rough | Rough | Rough |
| M5 Fine (9) | Fine | Fine | Fine | Fine | Fine | Fine | Rough | Rough |
| M6 Fine (10) | Fine | Fine | Fine | Fine | Fine | Fine | Fine | Rough |
| M7 Fine (10) | Fine | Fine | Fine | Fine | Fine | Fine | Fine | Fine |

FIG. 9

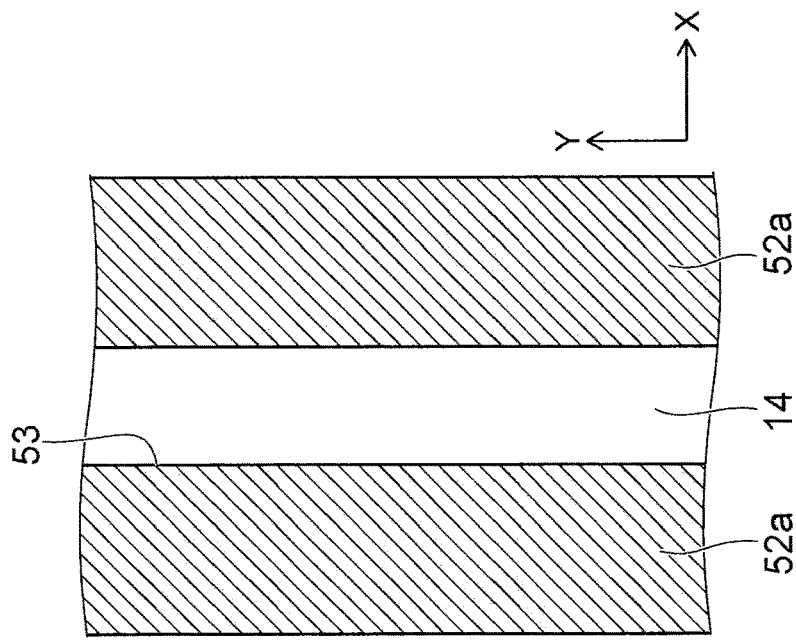
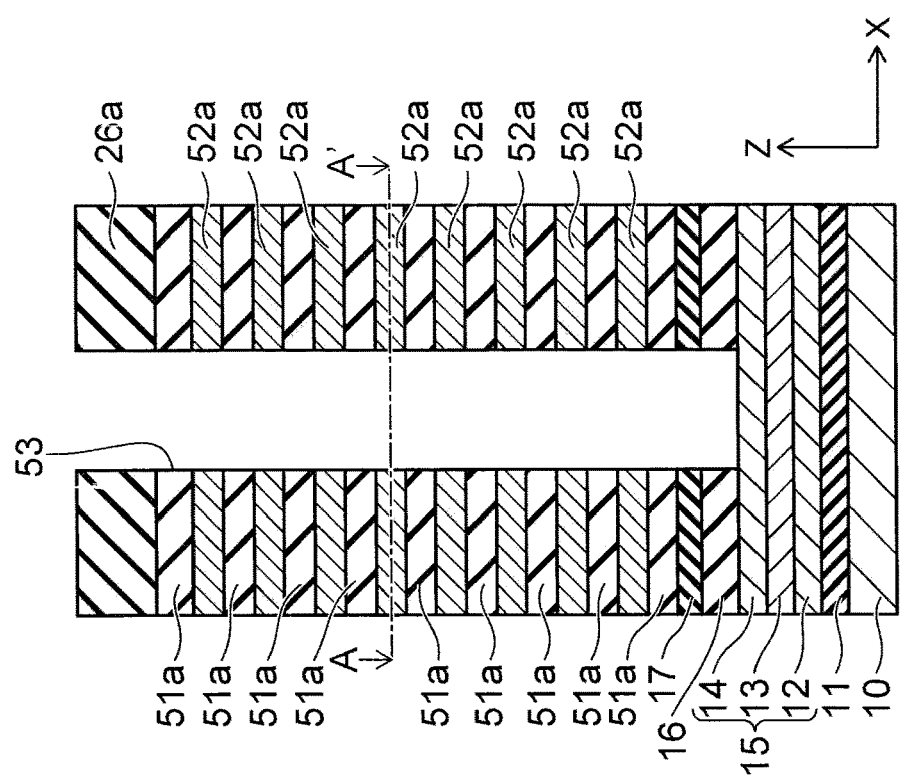
FIG. 13B
FIG. 13A

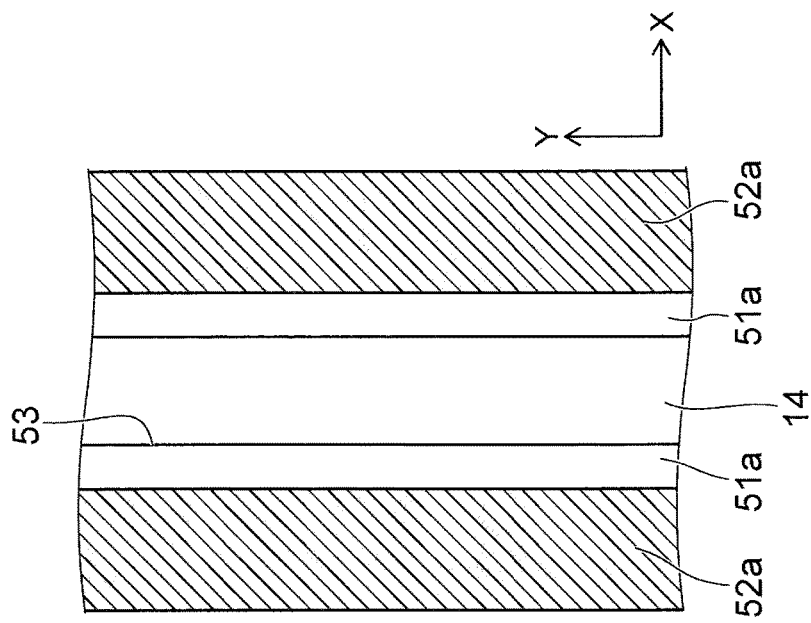
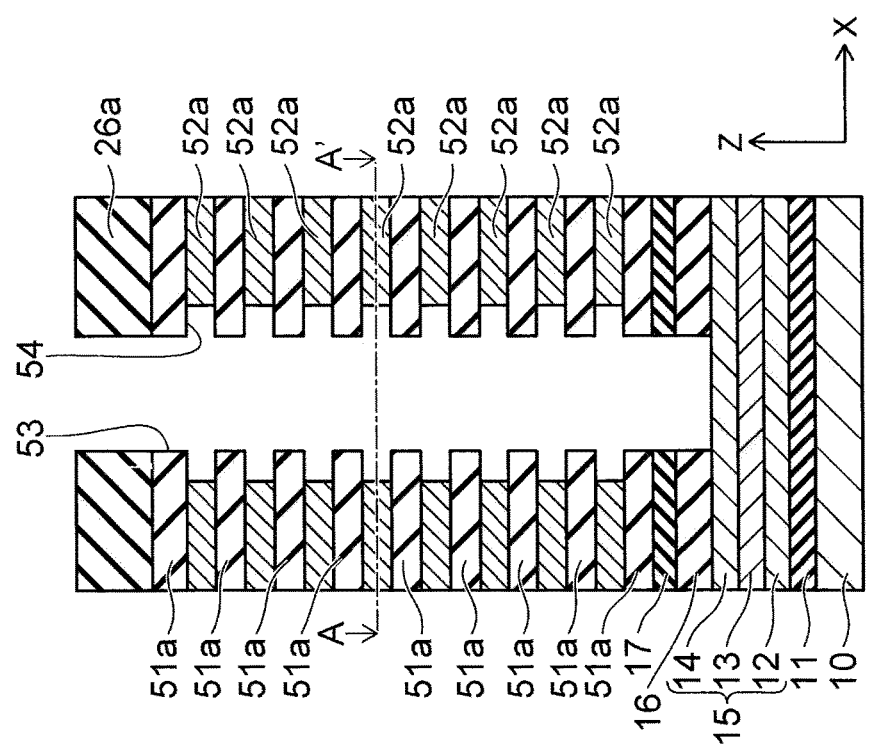
FIG. 14A
FIG. 14B

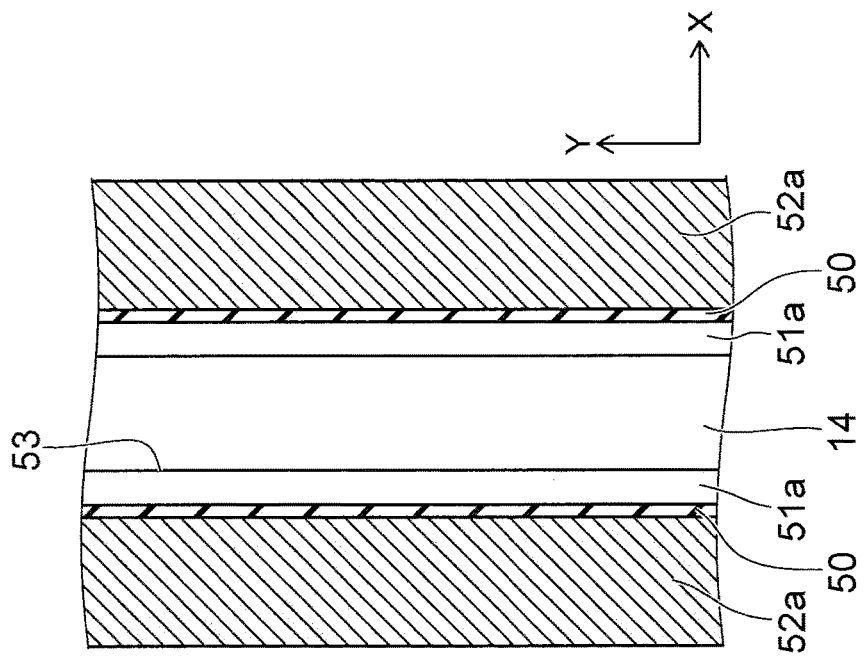
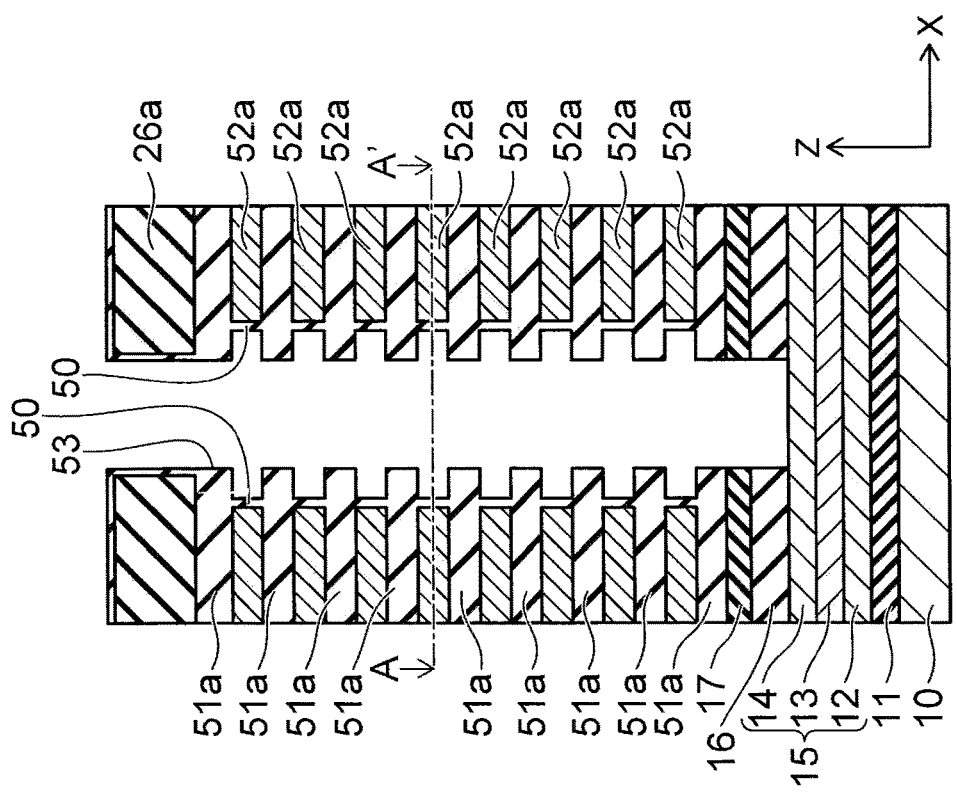
FIG. 15B
FIG. 15A

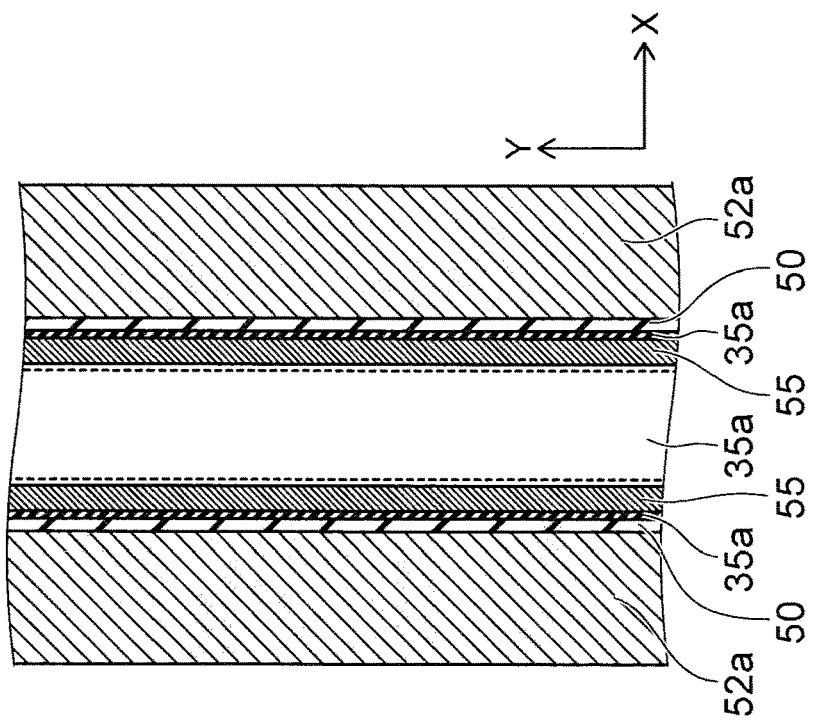
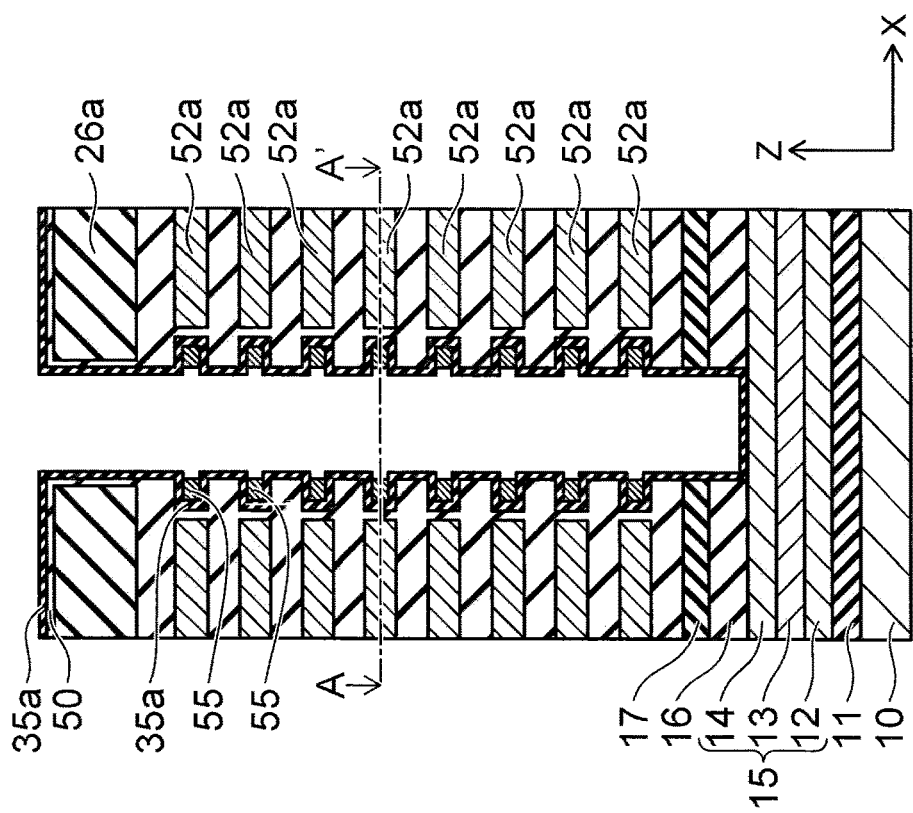
FIG. 17A
FIG. 17B

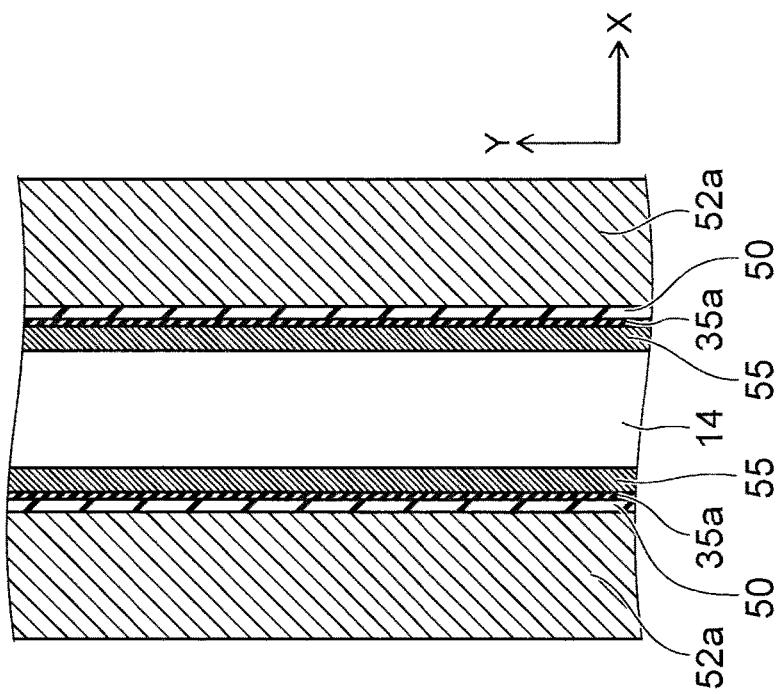
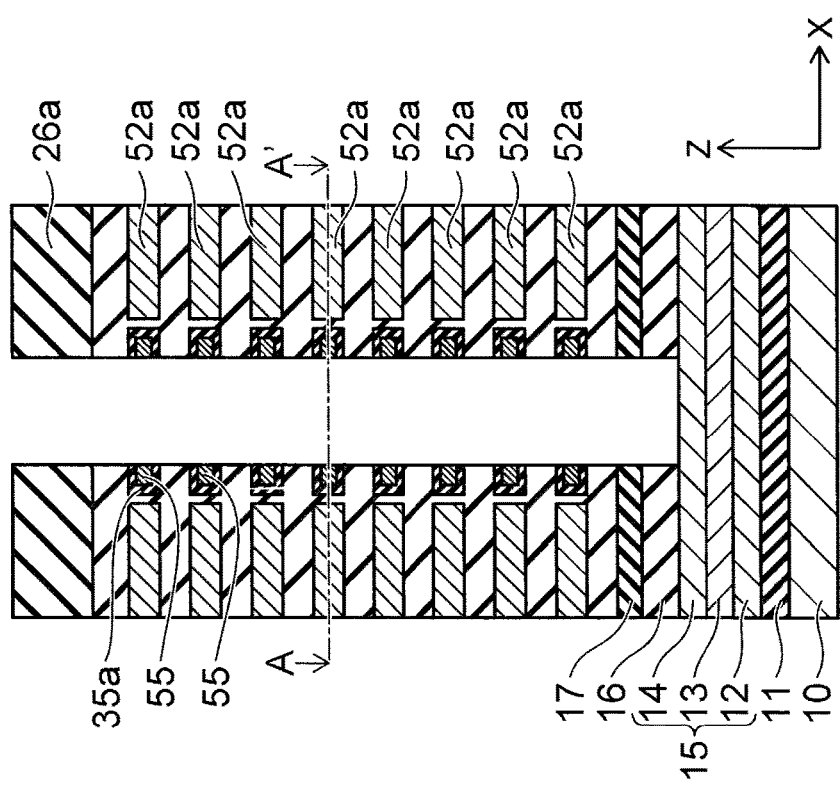
FIG. 18A
FIG. 18B

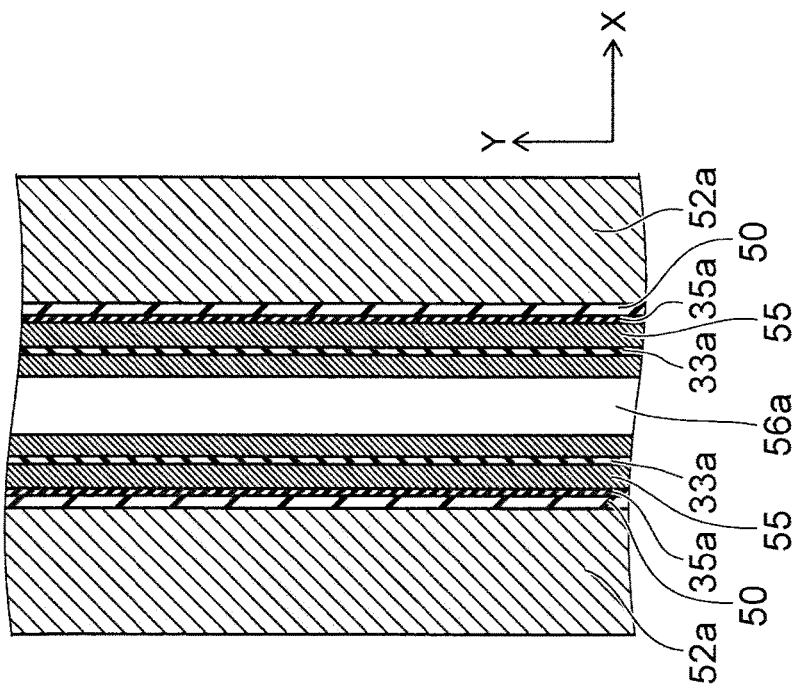
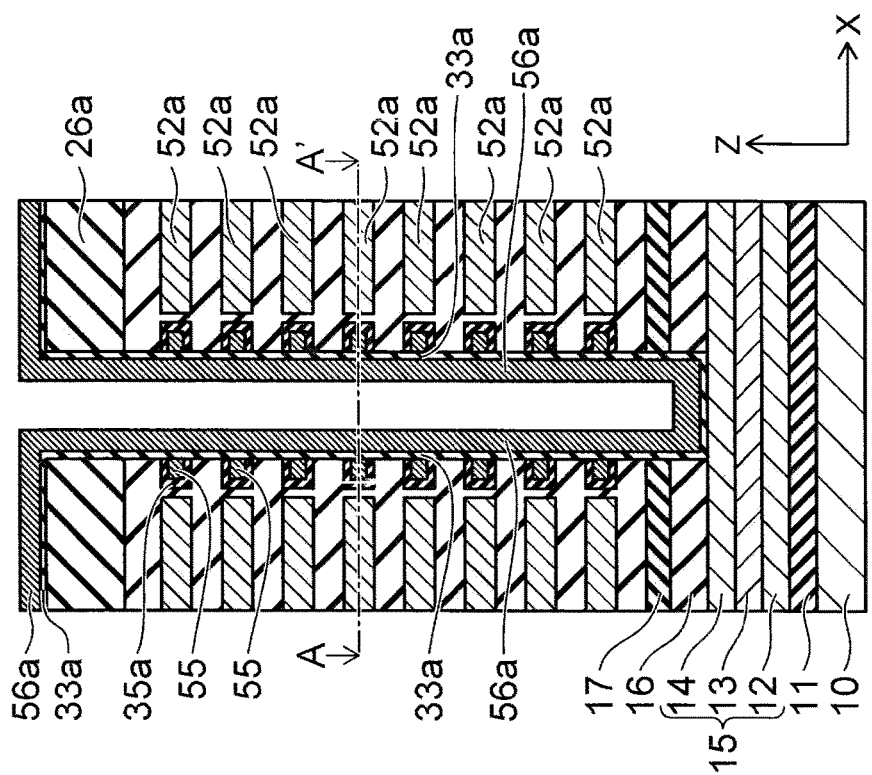
FIG. 19A
FIG. 19B

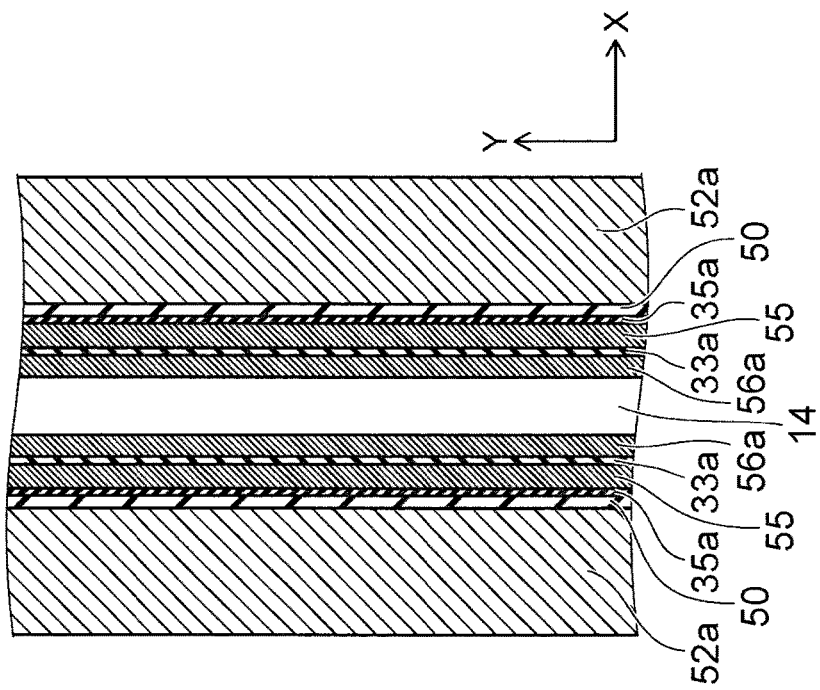
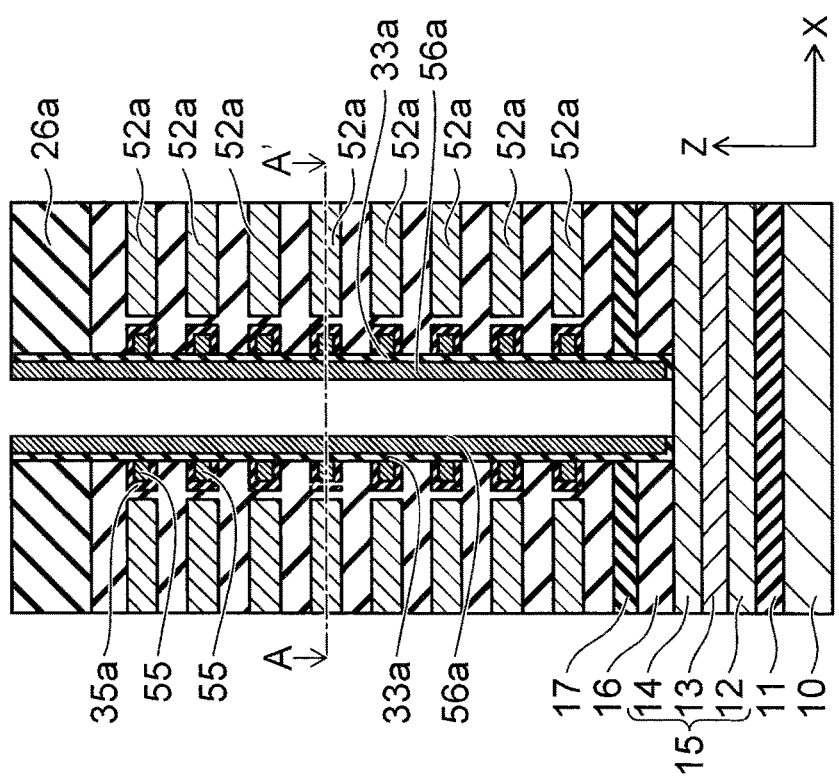
FIG. 20B
FIG. 20A

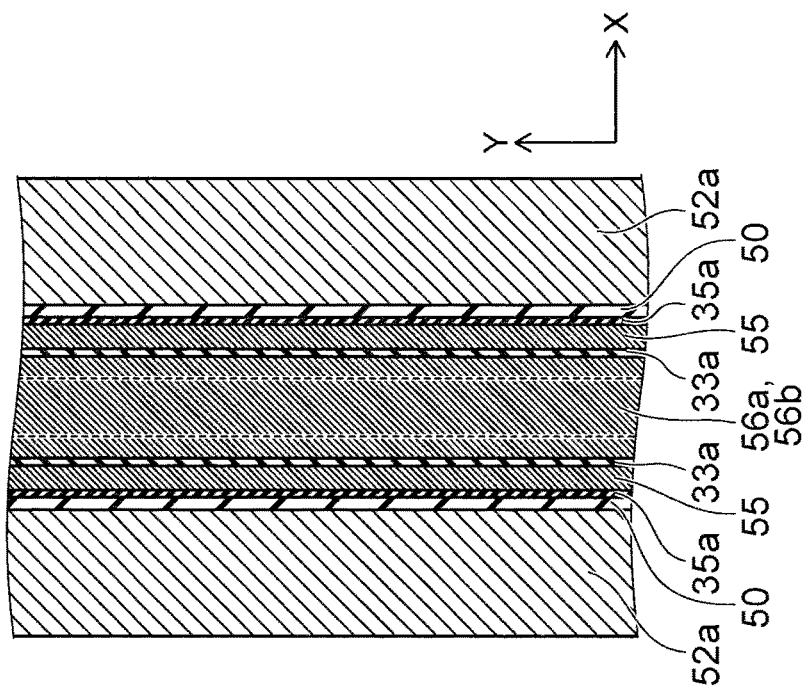
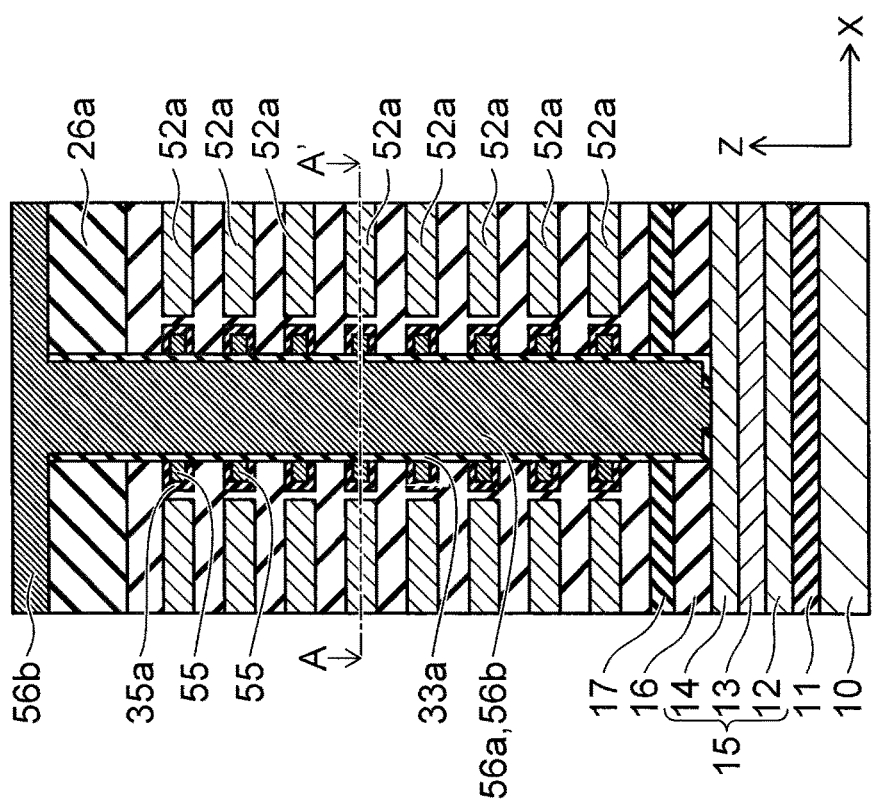
FIG. 21A
FIG. 21B

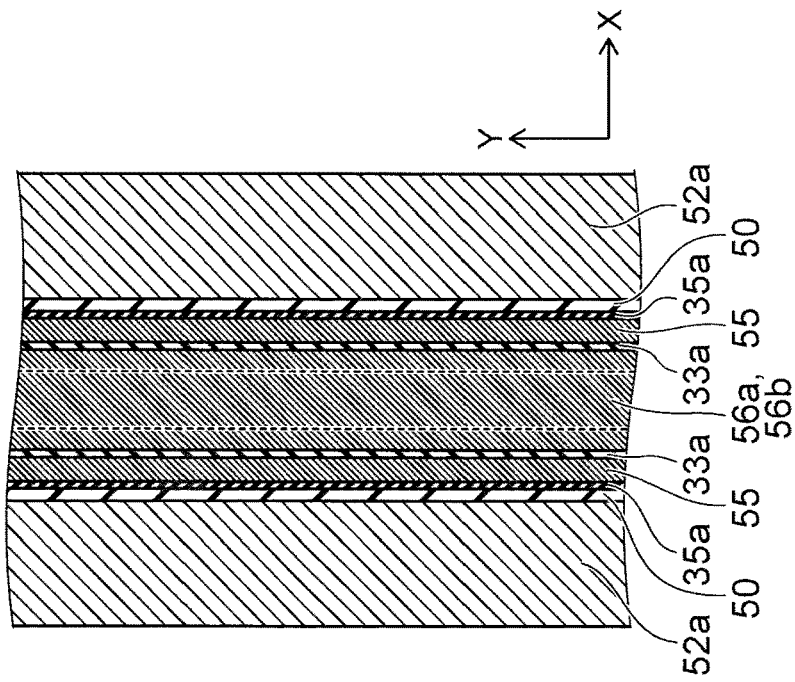
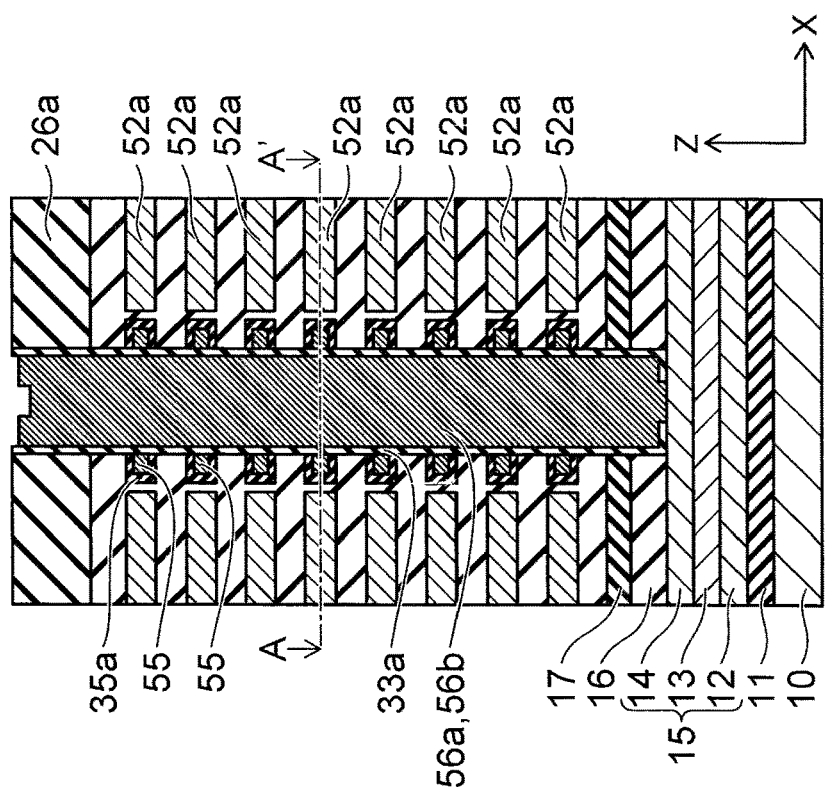
FIG. 22A
FIG. 22B

MEMORY DEVICE AND METHOD FOR OPERATING THE SAME

CROSS-REFERENCE TO RELATED APPLICATIONS

This application is based upon and claims the benefit of priority from Provisional Application No. 62/056,640 filed on Sep. 29, 2014; the entire contents of which are incorporated herein by reference.

FIELD

Embodiment described herein relates to a memory device and method for operating same.

BACKGROUND

In a NAND flash memory, an integration degree has been increased by refining of a plane structure to reduce a bit cost. In recent years, a technique for attaining further improvement of the integration degree by three-dimensionally stacking memory cells has been proposed.

BRIEF DESCRIPTION OF THE DRAWINGS

FIG. 3A is a sectional view illustrating the memory device according to the first embodiment on a plane parallel to a XZ plane concerning a memory cell region shown in FIG. 1;

FIG. 3B is a sectional view taken along A-A' in FIG. 3A;

FIG. 9 is a conceptual diagram for describing an operation method of a memory device according to the first embodiment;

FIG. 13A is a sectional view illustrating a manufacturing method for the memory device according to the first embodiment;

FIG. 13B is a sectional view taken along line A-A' in FIG. 13A;

FIG. 14A is a sectional view illustrating a manufacturing method for the memory device according to the first embodiment;

FIG. 14B is a sectional view taken along line A-A' in FIG. 14A;

FIG. 15A is a sectional view illustrating a manufacturing method for the memory device according to the first embodiment;

FIG. 15B is a sectional view taken along line A-A' in FIG. 15A;

FIG. 17A is a sectional view illustrating a manufacturing method for the memory device according to the first embodiment;

FIG. 17B is a sectional view taken along line A-A' in FIG. 17A;

FIG. 18A is a sectional view illustrating a manufacturing method for the memory device according to the first embodiment;

FIG. 18B is a sectional view taken along line A-A' in FIG. 18A;

FIG. 19A is a sectional view illustrating a manufacturing method for the memory device according to the first embodiment;

FIG. 19B is a sectional view taken along line A-A' in FIG. 19A;

FIG. 20A is a sectional view illustrating a manufacturing method for the memory device according to the first embodiment;

FIG. 20B is a sectional view taken along line A-A' in FIG. 20A;

FIG. 21A is a sectional view illustrating a manufacturing method for the memory device according to the first embodiment;

FIG. 21B is a sectional view taken along line A-A' in FIG. 21A;

FIG. 22A is a sectional view illustrating a manufacturing method for the memory device according to the first embodiment;

FIG. 22B is a sectional view taken along line A-A' in FIG. 22A;

DETAILED DESCRIPTION

According to an embodiment, an operation method for a memory device which has a first memory element and a second memory element respectively provided on both sides of a semiconductor member includes applying a first potential on the second word line to write a second data to the second memory and applying a second potential on the first word line to write the first data to the first memory. The first potential increases by a first step voltage and the second potential increases by a second step voltage.

Various embodiments will be described hereinafter with reference to the accompanying drawings.

First Embodiment

A first embodiment is described.

Figure 1:
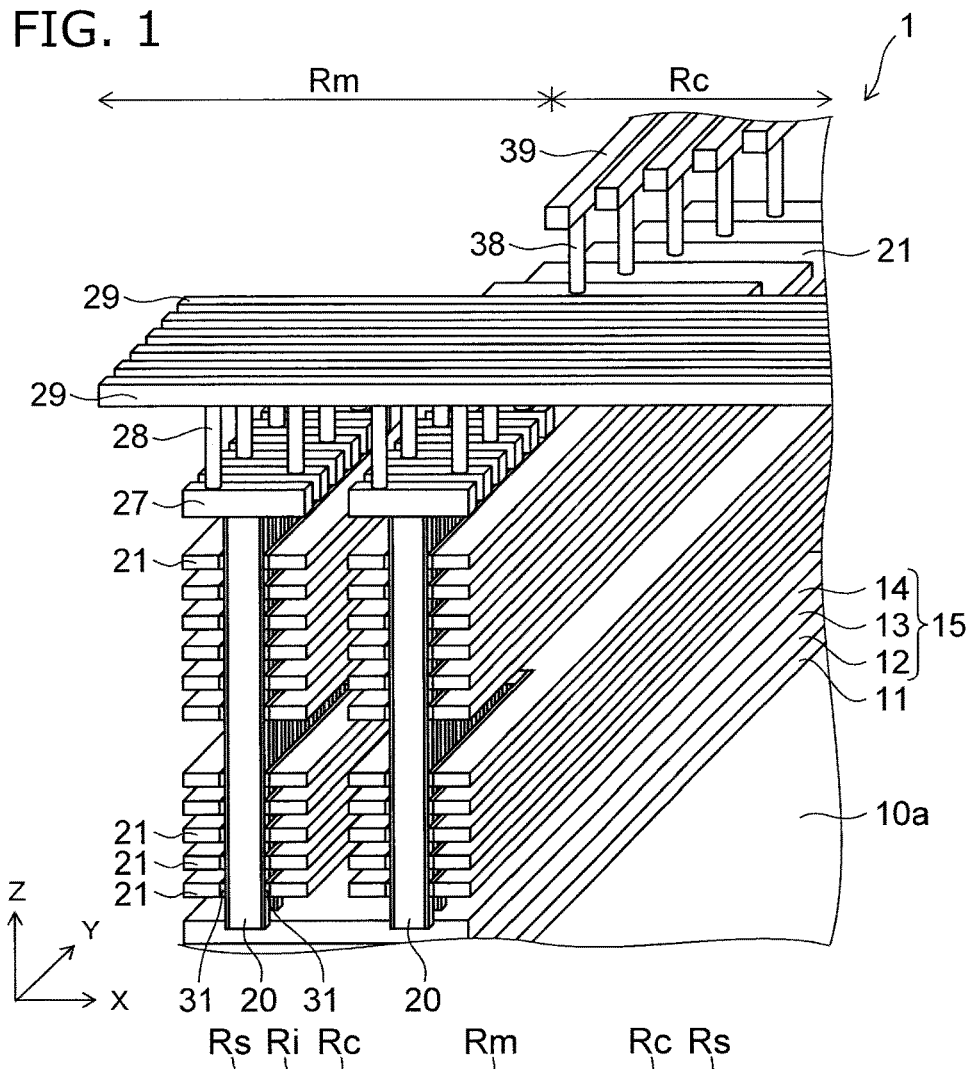
FIG. 1 is a perspective view illustrating a memory device according to the first embodiment.

FIG. 1 is a perspective view illustrating a memory device according to the first embodiment.

Figure 2:
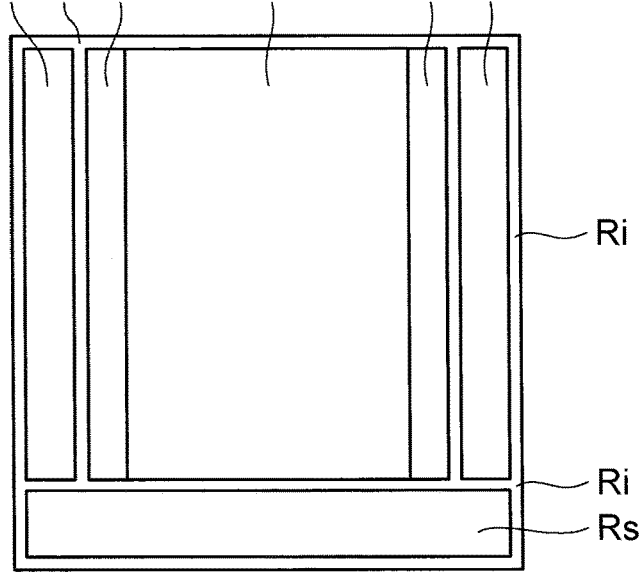
FIG. 2 is a plan view illustrating the memory device according to the first embodiment.

FIG. 2 is a plan view illustrating the memory device according to the first embodiment.

FIG. 3A is a sectional view illustrating the memory device according to the first embodiment on a plane parallel to a XZ plane concerning a memory cell region shown in FIG. 1.

FIG. 3B is a sectional view taken along A-A' in FIG. 3A.

As shown in FIGS. 1 and 2, a silicon substrate 10 is provided in a semiconductor memory device 1 according to the embodiment. On the silicon substrate 10, a memory cell region Rm, a word line leading region Rc, and a peripheral circuit region Rs including a control circuit are set. In the following description, for convenience of description, an XYZ orthogonal coordinate system is sometimes used in the specification. In the XYZ orthogonal coordinate system, two directions parallel to an upper surface 10a of the silicon substrate 10 and orthogonal to each other are referred to as "X-direction" and "Y-direction". A direction perpendicular to the upper surface 10a is referred to as "Z-direction".

The memory cell region Rm is a region where memory elements are three-dimensionally arrayed. The word line leading region Rc is provided in the vicinity of the memory cell region Rm in the semiconductor memory device 1. The word line leading region Rc includes a structure for leading interconnects from the memory elements on the memory cell region Rm. The peripheral circuit region Rs includes a control unit including a control circuit that selects, with respect to the led interconnects, voltages corresponding to operation modes of the semiconductor memory device 1 and applies the voltages to the memory elements. The memory cell region Rm, the word line leading region Rc, and the peripheral circuit region Rs are respectively surrounded by insulation regions Ri including insulating layers and are electrically insulated from one another.

As shown in FIGS. 1 and 3A, in the memory cell region Rm, an insulating layer 11, a conductive layer 12, an interconnection layer 13, and a conductive layer 14 are stacked in this order on the silicon substrate 10. For example, the insulating layer 11 is formed of a silicon oxide. The conductive layers 12 and 14 are formed of polysilicon. The interconnection layer 13 is formed of tungsten (W). A cell source line 15 is formed of the conductive layer 12, the interconnection layer 13, and the conductive layer 14. On the cell source line 15, insulating layers 16 and 17 made of, for example, a silicon oxide are provided. A plurality of silicon pillars 20 extending in the Z-direction are provided on the cell source line 15. The silicon pillars 20 are made of, for example, polysilicon. The lower ends of the silicon pillars 20 are connected to the cell source line 15 piercing through the insulating layers 16 and 17. When viewed from the Z-direction, the silicon pillars 20 are arrayed in a matrix shape along the X-direction and the Y-direction and connected to the single cell source line 15 in common.

The silicon pillar 20 is formed in a square pillar shape including a plane 20a extending along the Z-direction and a plane 20b present in a position opposed to the plane 20a in the X-direction. In a lateral direction of one plane 20a of the silicon pillar 20, a plurality of control gate electrode films (first electrode layers) 21 are provided spaced apart from one another along the Z-direction. In a lateral direction of the other plane 20b of the silicon pillar 20, a plurality of control gate electrode films 21 are also provided spaced apart from one another in the Z-direction. The control gate electrode films 21 provided in the lateral directions of the planes 20a and 20b on both sides of the silicon pillar 20 are disposed in positions opposed to each other across the silicon pillar 20. In other words, the silicon pillar 20 extending in the Z-direction is disposed between the control gate electrode films 21 disposed opposed to each other in the X-direction. Two control gate electrode films 21 are disposed between two silicon pillars 20 adjacent to each other in the X-direction. The control gate electrode films 21 extend in the Y-direction. Therefore, the control gate electrode films 21 are not disposed between the silicon pillars 20 arrayed adjacent to each other along the Y-direction. The control gate electrode films 21 are made of a gate electrode material such as polysilicon. The control gate electrode films 21 may be made of a high conductivity material such as tungsten (W), nickel silicide (NiSi), cobalt silicide (CoSi), or molybdenum silicide (MoSi).

Between the control gate electrode films 21 disposed between the silicon pillars 20, 20 adjacent to each other in the X-direction, an insulating layer 24 made of, for example, a silicon oxide is provided. Between the control gate electrode films 21 adjacent to each other in the Z-direction, below the bottom layer of the control gate electrode films 21 and above the top layer of the control gate electrode films 21, insulating layers 24 are provided. The control gate electrode films 21 and the insulating layers 24 are stacked in the Z-direction. A hard mask 26 is provided on the top layer of the insulating layers 24.

The silicon pillars 20 are led above the hard mask 26 and integrated with interconnects 27 that extend in the X-direction. Consequently, the silicon pillars 20 arrayed along the X-direction are connected to the interconnect 27 in common.

On the interconnects 27, vias 28 are provided piercing through an inter-layer insulating layer 23. On the vias 28, bit lines 29 extending in the X-direction are provided. The bit lines 29 are connected to the interconnects 27 via the vias 28. In this way, the silicon pillars 20 are connected between the bit lines 29 and the cell source line 15. That is, the semiconductor memory device 1 is a stacked memory device of an I-shaped pillar type.

As shown in FIG. 3B, between one plane 20a of the silicon pillar 20 and the control gate electrode film 21, floating gate electrode films 31 (charge storage layers) made of, for example, polysilicon are provided. The floating gate electrode films 31 are provided at respective crossing points of the silicon pillars 20 and the control gate electrode films 21. Therefore, the floating gate electrode films 31 are arrayed in a matrix shape spaced apart from one another in the Y-direction and the Z-direction. Note that, when viewed from the Z-direction, the shape of the floating gate electrode films 31 may be a fan shape, the control gate electrode film 21 side of which is expanded. In this case, the length in the Y-direction of ends of the floating gate electrode films 31 on the side of the silicon pillar 20 is smaller than the length in the Y-direction of ends of the floating gate electrode films 31 on the side of the control gate electrode film 21. Like the floating gate electrode films 31 on the side of one plane 20a, the floating gate electrode films 31 are also provided between the other plane 20b of the silicon pillar 20 and the control gate electrode film 21. The floating gate electrode films 31 on the side of the other plane 20b of the silicon pillar 20 are also provided at respective crossing points of the silicon pillars 20 and the control gate electrode films 21. Therefore, the floating gate electrode films 31 are arrayed in a matrix shape spaced apart from one another along the Y-direction and the Z-direction.

Between both the planes 20a and 20b of the silicon pillar 20 and the floating gate electrode films 31, tunnel insulating films 33 made of, for example, a silicon oxide are respectively provided. The tunnel insulating films 33 are provided in the respective planes 20a and 20b of the silicon pillar 20. The shape of the tunnel insulating films 33 is a belt shape having a thickness in the X-direction, having a width in the Y-direction, and extending in the Z-direction.

Block insulating films 34 are respectively provided between the floating gate electrode films 31 and the control gate electrode films 21 on the respective sides of both the planes 20a and 20b of the silicon pillar 20. The block insulating films 34 are, for example, three-layer films in which silicon nitride layers 35, silicon oxide layers 36, and silicon nitride layers 37 are stacked in this order from the floating gate electrode film 31 side to the control gate electrode film 21 side. The silicon nitride layers 35 are formed to surround planes of the floating gate electrode films 31 other than planes on which the tunnel insulating films 33 are formed. The silicon oxide layers 36 and the silicon nitride layers 37 are formed to surround the control gate electrode films 21.

The tunnel insulating films 33 are films that are usually insulative but, when a voltage in a range of a driving voltage of the semiconductor memory device 1 is applied thereto, allow a tunnel current to flow. The block insulating films 34 are films that do not substantially allow an electric current to flow even if the voltage in the range of the driving voltage of the semiconductor memory device 1 is applied thereto. An electric film thickness (EOT) of the tunnel insulating films 33 is larger than an electric film thickness of the block insulating films 34. A dielectric constant of the tunnel insulating films 33 is lower than a dielectric constant of the block insulating films.

Note that, in the example described in the embodiment, the block insulating films are the three-layer films. However, the block insulating films are not limited to this. The layers forming the block insulating films are not limited to the silicon oxide layer ($SiO_2$ layer) and the silicon nitride layer ($Si_3N_4$ layer). The block insulating films may be, for example, stacked films including a high dielectric layer such as an $Al_2O_3$ layer, an MgO layer, an SrO layer, an SiN layer, a BaO layer, a TiO layer, a $Ta_2O_5$ layer, a $BaTiO_3$ layer, a BaZrO layer, a $ZrO_2$ layer, a $Y_2O_3$ layer, a ZrSiO layer, an $HfO_2$ layer, an HfAlO layer, an HfSiO layer, an $La_2O_3$ layer, or an LaAlO layer.

In the example described in the embodiment, the floating gate electrode films 31 are formed of polysilicon. However, the floating gate electrode films 31 are not limited to this and may be formed of metal silicide or metal.

In the example described in the embodiment, the control gate electrode films 21 are formed of tungsten W. However, the control gate electrode films 21 are not limited to this and may be formed of metal silicide by embedding a polysilicon film and thereafter siliciding the polysilicon film.

Further, in the example described in the embodiment, the memory cell transistor in which the floating gate electrode film is the conductive film is formed. However, a memory cell of a so-called MONOS (Metal-Oxide-Nitride-Oxide-Semiconductor) type in which the floating gate electrode film is replaced with an insulating film may be formed.

In this way, memory elements 30 including the control gate electrode films 21, the block insulating films 34, the floating gate electrode films 31, and the tunnel insulating films 33 are respectively formed at the crossing points of the silicon pillars 20 and the control gate electrode films 21. The memory elements 30 are formed on both the planes 20a and 20b of the silicon pillar 20 line-symmetrically with respect to an axis B-B' that passes the center in the Y-direction of the silicon pillar 20. The silicon pillar 20 is used in common in the memory elements 30 arrayed in the Z-direction. The memory elements 30 disposed spaced apart from one another in the Z-direction form memory element strings 40. Therefore, the memory element strings 40 are respectively formed on the two planes 20a and 20b of the one common silicon pillar 20.

The word line leading region Rc includes a region used for leading a interconnect for driving the control gate electrode films 21. In the word line leading region Rc, as shown in FIG. 1, the insulating layer 11, the conductive layer 12, the interconnection layer 13, and the conductive layer 14 are stacked in this order on the silicon substrate 10 common to the memory cell region Rm. The cell source line 15 is formed of the conductive layer 12, the interconnection layer 13, and the conductive layer 14. The insulating layers 16 and 17 cover the cell source line 15. In the word line leading region Rc, the insulating layers 24 made of silicon oxide films and the control gate electrode films 21 made of polysilicon films are alternately stacked on the insulating layers 16 and 17.

In the memory cell region Rm, a plurality of the control gate electrode films 21 formed spaced apart from one another in the Z-direction extend in the Y-direction. In the word line leading region Rc, as shown in FIG. 1, a stacked body 25 including the control gate electrode films 21 and the insulating layers 24 is processed in a step shape. In the word line leading region Rc, the vias 38 are provided to pierce through to the layers of the control gate electrode films 21 connected thereto. Word lines 39 extending in the Y-direction are provided on the vias 38. The positions of the word lines 39 in the Z-direction are equal to the positions of the bit lines 29. The word lines 39 are connected to the control gate electrode films 21 via the vias 38. Note that the end in the Y-direction of the stacked body is not limited to the step shape and may be fabricated in a wall surface shape like the other planes.

The word lines 39 led in this way are connected to a control unit described below in the word line leading region Rc. The bit lines 29 and the cell source line 15 are also connected to the control unit in the word line leading region.

In the silicon pillar 20, according to a voltage applied to the control gate electrode films 21, presence or absence of charges in the floating gate electrode films 31, and a voltage applied to both ends of the silicon pillar 20, a channel is formed on the surface of the silicon pillar 20 to provide a route for feeding charges. In the semiconductor memory device 1, a voltage in the range of the driving voltage of the semiconductor memory device 1 is applied to the control gate electrode films 21 to feed the charges, which flow through the formed channel, as a tunnel current via the tunnel insulating films 33. When the tunnel current flows, the charges are injected into the floating gate electrode films 31. The charges injected into the floating gate electrode films 31 are led out to the silicon pillar 20, which provides the channel, via the tunnel insulating films 33. In the semiconductor memory device 1, a threshold voltage of the memory elements 30 changes according to presence or absence of charges in the floating gate electrode films 31. When a predetermined voltage is applied to the control gate electrode films 21 of the memory elements 30, a change in the threshold voltage is determined according to whether an electric current flows. For example, a case in which the electric current flows is associated with "1" and a case in which the electric current does not flow is associated with "0". In this way, in the memory elements 30, data is stored in a nonvolatile manner, erased, and read out.

In the semiconductor memory device 1 of the embodiment, the memory element strings 40 are arrayed in a lattice shape on an XY plane on the silicon substrate 10, whereby the memory elements 30 are three-dimensionally arrayed. Therefore, in the semiconductor memory device 1, compared with a case in which memory elements are two-dimensionally arrayed, a bit integration degree per unit area of the silicon substrate 10 can be improved. Typically, a memory unit of 1 bit is allocated per one memory element 30. However, a memory unit of ternary or larger values can be allocated by causing the memory element 30 to store a plurality of values. The integration degree can be substantially further improved. In the semiconductor memory device 1 of the embodiment, one silicon pillar 20 is used in common in two memory element strings 40. Therefore, it is possible to reduce the length in the X-direction and further improve the bit integration degree.

As described above, in the semiconductor memory device 1 of the embodiment, the memory elements 30 are formed in opposed positions on the opposed two planes 20a and 20b. The silicon pillar 20 is used in common between the two memory elements 30. Therefore, a voltage applied to the control gate electrode films 21 of the memory elements 30 on the side of one plane affects an operation condition of the memory elements 30 on the side of the other plane present in the opposed positions. As described below, in order to prevent the silicon pillar 20 from falling into a complete depletion state depending on an applied state of the voltage of any one of the planes 20a and 20b of the silicon pillar 20, the silicon pillar 20 is desirably formed of doped polysilicon in which p-type impurities are introduced or non-doped polysilicon including a defect of an acceptor type.

A circuit configuration of the semiconductor memory device 1 according to the embodiment is described.

Figure 4:
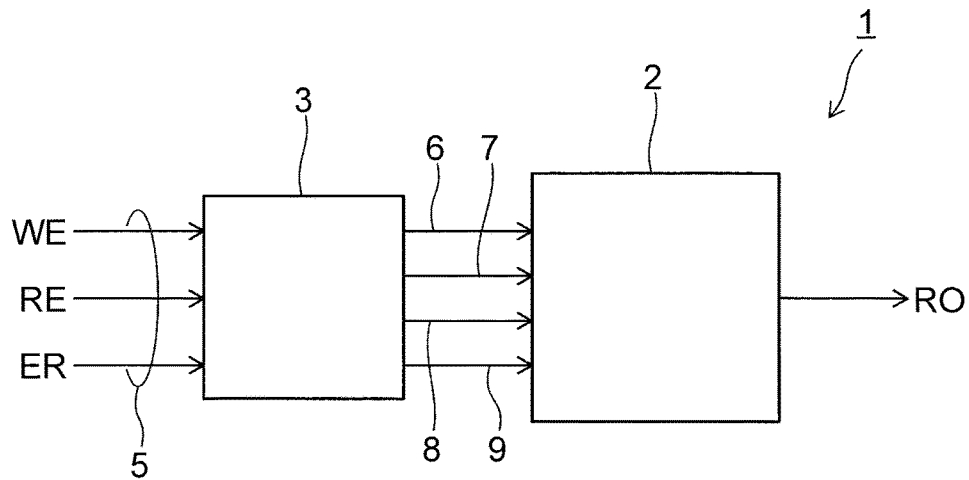
FIG. 4 is a block diagram illustrating the memory device according to the first embodiment.

FIG. 4 is a block diagram illustrating the memory device according to the first embodiment.

Figure 5:
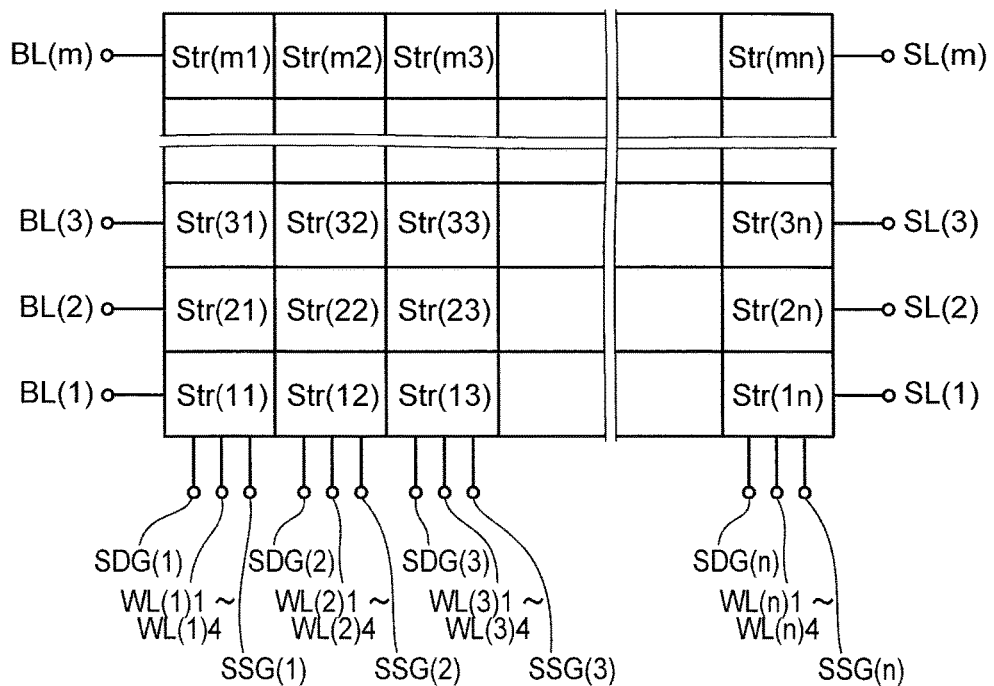
FIG. 5 is a block diagram illustrating arrangement of memory strings of the memory device and connection of terminals of the memory device according to the first embodiment.

FIG. 5 is a block diagram illustrating arrangement of memory strings of the memory device and connection of terminals of the memory device according to the first embodiment.

Figure 6:
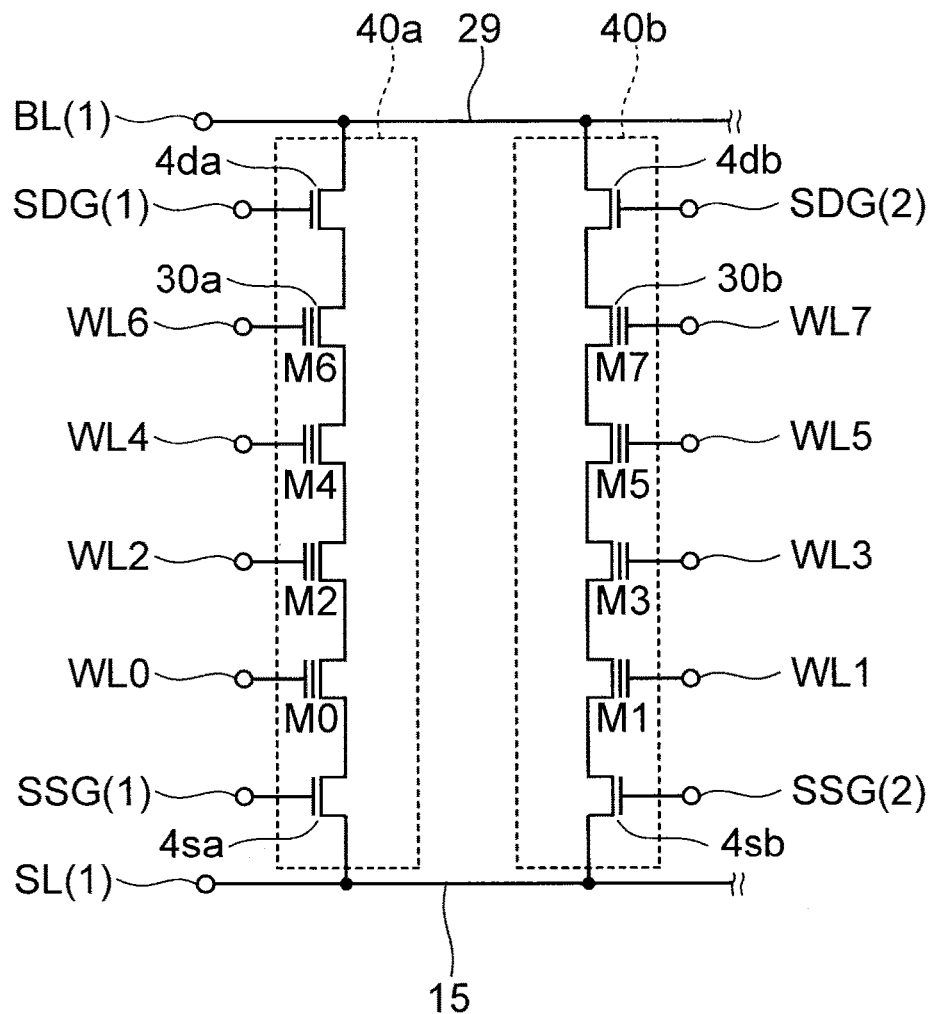
FIG. 6 is a circuit diagram illustrating a part of an array of the memory strings of the memory device according to the first embodiment.

FIG. 6 is a circuit diagram illustrating a part of an array of the memory strings of the memory device according to the first embodiment.

As shown in FIG. 4, the semiconductor memory device 1 according to the embodiment includes a memory cell 2 and a control unit 3.

The memory cell 2 includes the memory element strings 40 arrayed in a matrix shape in the memory cell region Rm. The memory elements 30 are three-dimensionally disposed on the memory cell 2.

The control unit 3 is formed in the peripheral circuit region Rs that is adjacent to the word line leading region Rc. The control unit 3 includes a mode selection line 5 that selects operation modes. The operation modes include a write mode for writing data in the memory elements 30, a readout mode for reading out the data written in the memory elements 30, and an erase mode for erasing the data written in the memory elements 30. The mode selection line 5 includes three selection lines to which, for example, a write enable signal WE, a readout enable signal RE, and an erasing signal ER are respectively input. When the write enable signal is input to the mode selection line 5, the semiconductor memory device 1 changes to the write mode. When the readout enable signal is input, the semiconductor memory device 1 changes to the readout mode. When the erasing signal is input, the semiconductor memory device 1 changes to the erase mode. The control unit 3 may set ternary analog values corresponding to these operation modes to make it possible to set the operation modes according to an analog value allocated to one mode selection line 5.

The control unit 3 includes a bit line selection line 6, a cell source line selection line 7, a selection transistor selection line 8, and a word line election line 9. The control unit 3 appropriately selects the bit line selection line 6, the cell source line selection line 7, the selection transistor selection line 8, and the word line selection line 9 and applies a voltage corresponding to the operation mode to a desired memory element 30. The bit line selection line 6 selects any one of the bit lines 29 and applies a predetermined voltage to the selected bit line 29. The cell source line selection line 7 selects any one of the cell source lines 15 and applies a predetermined voltage to the selected cell source line. The selection transistor selection line 8 applies a voltage to a gate electrode of a specific selection transistor for selecting a specific column among the memory element strings 40 arrayed in the lattice shape. The word line selection line 9 selects any one of the memory elements 30 and applies a predetermined voltage to the control gate electrode film 21 of the selected memory element 30.

When the write mode is selected by the control unit 3, the memory cell 2 enables an input of write data and writes the write data in the memory element selected by the control unit 3. When the readout mode is selected by the control unit 3, the memory cell 2 reads out data from the selected memory element and outputs the data as readout data RO. The read-out readout data RO is amplified by, for example, a sense amplifier and output.

As shown in FIG. 5, when the matrix of the memory element strings 40 arrayed on the memory cell region Rm is m rows×n columns, the memory element strings 40 are represented as Str(ij). Str(ij) represents the memory element string 40 in an i-th row and a j-th column. A cell source line and a bit line in the i-th row are respectively represented as SL(i) and BL(i).

An equivalent circuit of a first row and a second row extracted from the matrix of the memory element strings 40 is as shown in FIG. 5. Here, a memory element string 40a and a second memory element string 40b in the first row are respectively formed on the one plane side 20a and the other plane side 20b of the same silicon pillar 20. The memory elements 30 are connected in series and connected between the cell source line 15 and the bit line 29. Concerning the respective memory element strings 40a and 40b, selection transistors 4sa and 4sb are respectively connected between the memory element 30 of the bottom layer and the cell source line 15. Selection transistors 4da and 4db are respectively connected between the memory element 30 of the top layer and the bit line 29. The selection transistors 4sa, 4sb, 4da, and 4db may have structure same as the structure of the memory element 30. However, charge injection via the tunnel insulating film 33 is not executed on the selection transistors 4sa, 4sb, 4da, and 4db. For simplification, the number of the memory elements 30 connected in series is four in the following description. However, five or more memory elements 30 may be connected. In this way, the memory element strings 40a and 40b include a plurality of the memory elements 30 and the selection transistors 4sa, 4sb, 4da, and 4db.

The memory elements 30 formed using the same silicon pillar 20 are referred to as zero-th bit M0 to seventh bit M7 in order from the bottom as shown in the figure. A word line (a control gate electrode film) of the memory element 30 of a p-th bit is represented as WLp. Selection lines to which gate electrodes of the selection transistors in the j-th column are connected are referred to as SSG(j) and SDG(J). SSG(j) is a selection line for a selection transistor on a cell source line side. SDG(j) is a selection line for a selection transistor on a bit line side.

A gate terminal of the memory element 30 is formed of the control gate electrode film 21. Gate terminals of the memory elements 30 adjacent to each other in the Y-direction are connected. As described above, the control gate electrode film 21 is led to the end in the Y-direction of the memory cell region Rm and connected to the control unit 3 via the word lines 39 in the word line leading region Rc. The control gate electrode film 21 is sometimes connected to the control gate electrode film 21 of the memory element 30 in another column in the word line leading region Rc. For example, when word lines in a first column and a second column of bits are connected to one another, the word lines in the second column are simultaneously selected when the word line of any one of the bits in the first column is selected. When the word line in the second column is selected, the word line in the first column is simultaneously selected. Therefore, a desired row can be selected by providing the selection transistors 4sa, 4sb, 4da and 4db. Selection lines SSG and SDG for the selection transistors 4sa, 4sb, 4da, and 4db are respectively connected by the control gate electrode films 21 of the selection transistors 4sa, 4sb, 4da and 4db adjacent to one another in the Y-direction, led to the end in the Y-direction of the memory cell region Rm, and connected to the control unit via the word line 39 in the periphery region. The selection lines SSG and SDG to which gates of the selection transistors 4sa, 4sb, 4da and 4db are connected are not connected to gate electrodes of the selection transistors 4sa, 4sb, 4da and 4db adjacent to one another in the X-direction unlike the gate electrodes of the memory elements 30.

The cell source line 15 and the bit line 29 are provided for each row. By selecting the cell source line 15 and/or the bit line 29 of a relevant row, the row can be selected. By selecting the selection lines SSG and SDG of the selection transistors 4sa and 4db or 4sb and 4db of a relevant column, a desired column is selected. When the word line 39 is selected, the memory element 30 in a desired bit position is selected.

For example, a memory element M0 of a zero-th bit of the memory element string 40 in a first row and a first column is selected as described below.

The cell source line 15 and/or the bit line 29 in the first row, that is, SL(1) and/or BL(1) is selected.

The selection transistor 4sa and/or 4da in the first column, that is, SSG(1) and/or SDG(1) is selected.

Consequently, a memory element string Str(11) in the first row and the first column is selected.

Subsequently, the word line 39 of the zero-th bit M0 in the first column, that is, WL2 is selected and a desired memory element is selected.

Concerning the selection of the cell source line 15 and the bit line 29, both or any one of the cell source line 15 and the bit line 29 is selected according to the operation mode of the semiconductor memory device 1, that is, any one of the write mode, the readout mode, and the erase mode. Concerning the selection of SSG(j) and SDG(j), similarly, both or one of SSG(j) and SDG(j) is selected according to the operation mode. As described below, concerning a voltage applied to the control gate electrode film 21 of the selected memory element 30, a voltage applied to the control gate electrode films 21 of the unselected memory elements, and the like, an appropriate voltage is selected according to the operation mode.

In the semiconductor memory device 1 of the embodiment, in the case of the write mode, order of writing data is set between a memory element 30a in which the data is written and a memory element 30b present in a position opposed to the memory element 30a via the silicon pillar 20. Order of writing data is also set between the memory element 30a in which the data is written and the memory element 30a having the silicon pillar in common and disposed spaced from the memory element 30a in the Z-direction. The control unit 3 controls the writing order of the data.

An operation method of the semiconductor memory device 1 according to the embodiment is described.

Figure 7:
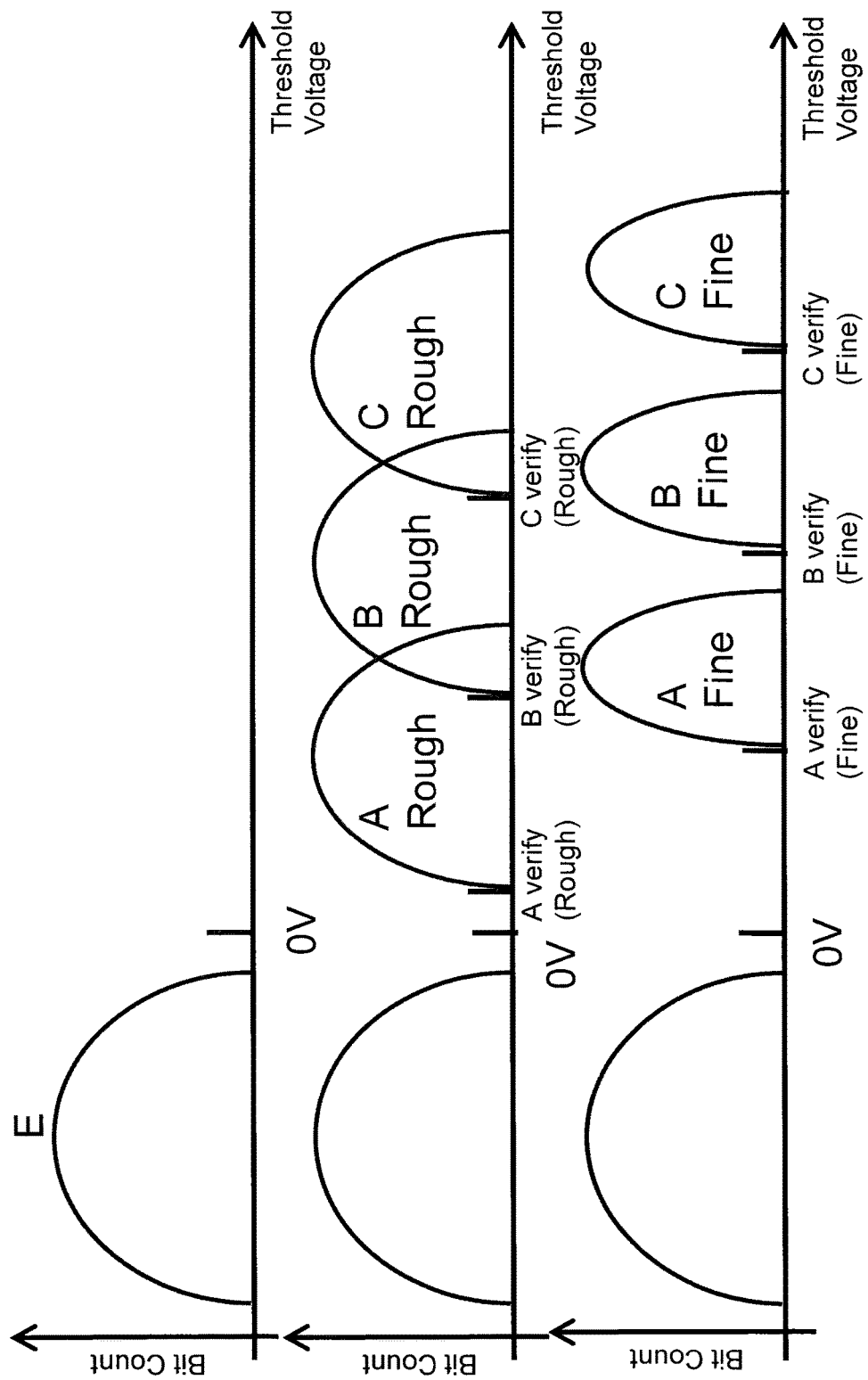
FIG. 7 is a conceptual diagram for describing an operation method of a memory device according to the first embodiment.
Figure 8:
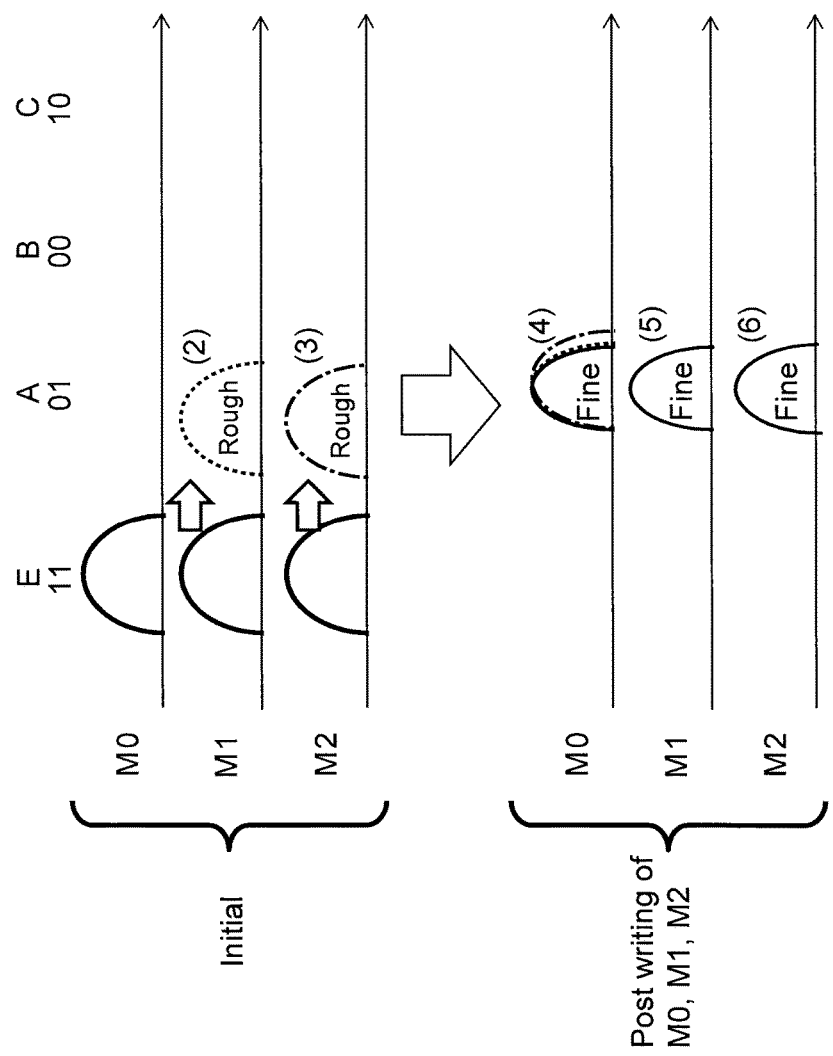
FIG. 8 is a conceptual diagram for describing an operation method of a memory device according to the first embodiment.

FIGS. 7 to 9 are conceptual diagrams for describing an operation method of a memory device according to the first embodiment.

Figure 10A:
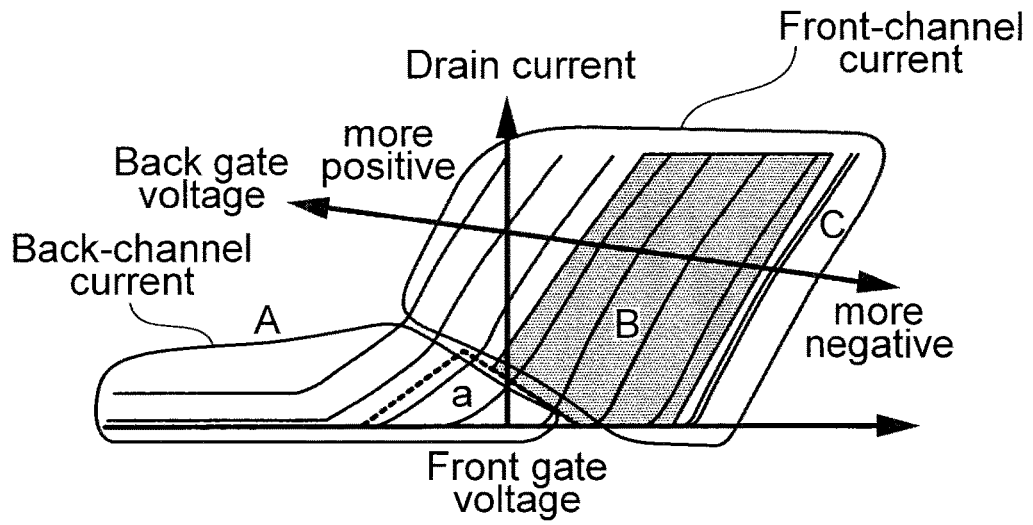
FIG. 10A is a graph indicating to what degree of a voltage on a back gate side affects an I-V characteristic which shows the threshold voltage on a front gate side in a MOSFET of an SOI structure.

FIG. 10A is a graph indicating to what degree of a voltage on a back gate side affects an I-V characteristic which shows the threshold voltage on a front gate side in a MOSFET of an SOI structure.

Figure 10B:
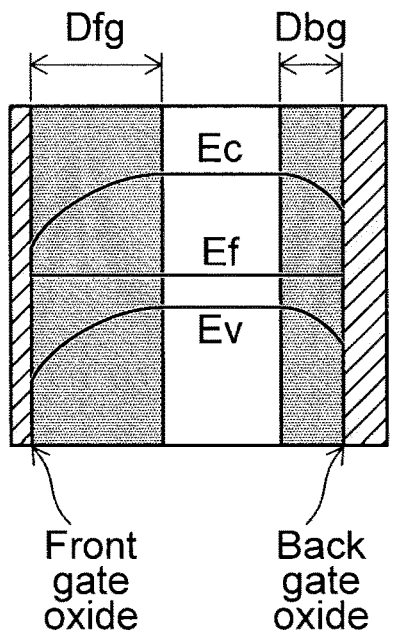
FIG. 10B is a conceptual diagram for describing a threshold voltage shift of the MOSFET of the SOI structure in a B region of the graph of FIG. 10A.

FIG. 10B is a conceptual diagram for describing fluctuation of a threshold voltage of the MOSFET of the SOI structure in a B region of the graph of FIG. 10A.

Figure 11:
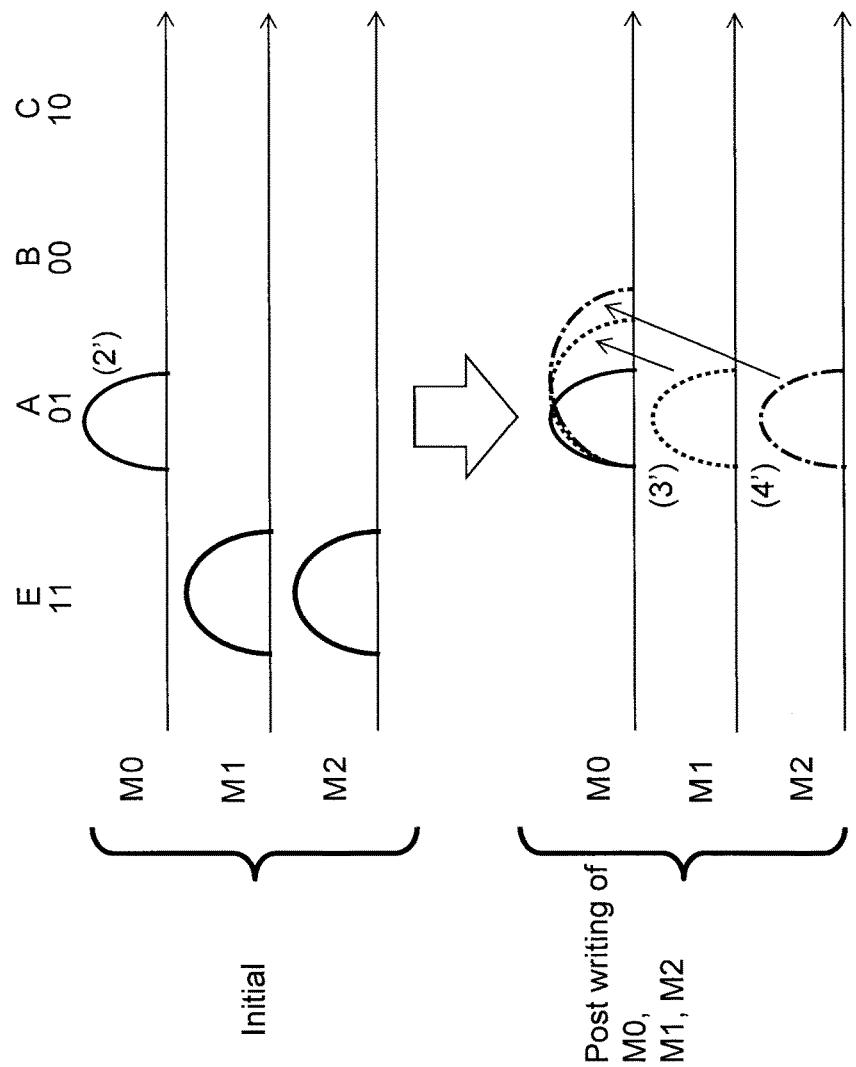
FIG. 11 is a conceptual diagram for describing an operation method of a memory device according to a comparative example of the first embodiment.

FIG. 11 is a conceptual diagram for describing the operation method of the memory device according to a comparative example of the first embodiment.

The memory elements 30 can improve a bit integration degree by associating not only binary values of 0 and 1 but also ternary values with presence and absence of data. In the following explanation, the memory elements 30 can take data of quaternary values. The data are data in an E level, an A level, a B level, and a C level in an ascending order of a threshold voltage during readout of the memory elements 30. For example, data of 11, 01, 00, and 10 are associated with the respective levels in binary representation. FIGS. 6 and 7 are conceptual frequency distribution diagrams in which a value of a threshold voltage that the plurality of memory elements 30 can take is plotted on the abscissa and a frequency at which the memory element 30 corresponding to the threshold voltage is present is plotted on the ordinate.

As shown in a diagram at the top of FIG. 6, in an initial state (an erasing state) of the memory element 30, electrons are not injected into the floating gate electrode film 31. The floating gate electrode film 31 has a threshold voltage lower than a threshold voltage Vth0. The threshold voltage Vth0 is, for example, 0 V. In this case, the memory element 30 in the E level indicates a characteristic of a depletion type MOS-FET having a minus threshold voltage.

A diagram in the middle of FIG. 6 shows a distribution example of threshold voltages at the time when rough writing is executed. Verify voltages (rough) corresponding to the respective levels are set. That is, an A level verify voltage (rough) corresponding to the A level, a B level verify voltage (rough) corresponding to the B level, and a C level verify voltage (rough) are set. These verify voltages (rough) are set to larger values in the order of the A level verify voltage, the B level verify voltage corresponding to the B level, and the C level verify voltage. When writing is executed, the writing is executed to set a threshold larger than the verify voltages.

A diagram at the bottom of FIG. 6 shows a distribution example of threshold voltages at the time when fine writing is executed. In the case of the fine writing, verify voltages (fine) corresponding to the levels are also set. That is, an A level verify voltage (fine) corresponding to the A level, a B level verify voltage (fine) corresponding to the B level, and a C level verify voltage (fine) are set. These verify voltage (fine) are set to larger values in the order of the A level verify voltage (fine), the B level verify voltage (fine) corresponding to the B level, and the C level verify voltage (fine). The verify voltages of the fine writing have a relation described below with the verify voltages of the rough writing. That is, the verify voltage (fine) of the A level is set to a value larger than the verify voltage (rough) of the A level. The verify voltage (fine) of the B level is set to a value larger than the verify voltage (rough) of the B level. The verify voltage (fine) of the C level is set to a value larger than the verify voltage (rough) of the C level.

A writing operation of a NAND flash memory is described.

In general, the writing operation of the NAND flash memory is performed by Incremental Stepup Programming. After a write enable signal is input to the control unit, the writing operation is executed on a procedure described below.

First, as an initial writing voltage, a lowest voltage, for example, a writing voltage Vpgm of 12 V is applied to word lines of a writing target memory element.

In order to check whether the memory element has a predetermined writing level of the threshold voltage, readout of data is performed from the memory element written at 12 V. Such a readout operation is referred to as verify readout. The predetermined writing level is the verify voltage described above.

When the writing voltage Vpgm does not reach the predetermined writing level, the writing voltage Vpgm is increased by a step-up voltage $\Delta V$ and applied to the word lines. For example, when the step-up voltage $\Delta V$ is 0.5 V, the writing voltage Vpgm is 12.5 V. The verify readout is executed again to check whether the voltage reaches the predetermined writing level.

The operation is repeated until the writing voltage Vpgm reaches the predetermined writing level.

The step-up voltage $\Delta V$ can be arbitrarily set. By setting the step-up voltage $\Delta V$ to a small value, it is possible to more accurately perform setting of the writing voltage Vpgm. It is possible to narrow distribution of threshold voltages after the writing. On the other hand, when the step-up voltage $\Delta V$ is set small, the number of times of repetition of the writing operation and the verify readout operation increases. Therefore, a writing time increases.

In the operation method of the memory device of the embodiment, a writing operation for realizing a short-time writing operation using a large step-up voltage $\Delta Vr$ is referred to as rough writing. A writing operation for performed using a step-up voltage $\Delta Vf$ smaller than $\Delta Vr$ is referred to as fine writing. A relation between the step-up voltages of the rough writing and the fine writing is $\Delta Vr > \Delta Vf$.

As shown in the diagram in the middle of FIG. 6, when the rough writing is executed, the distribution of the threshold voltages of the respective levels expands. The threshold voltage is sometimes the same degrees as the level adjacent to the threshold voltage. On the other hand, as shown in the diagram at the bottom of FIG. 6, by executing the fine writing, it is possible to narrow the distribution of the threshold voltages of the respective levels. The fine writing is adopted in the writing operation of the general NAND flash memory.

Writing of data in the zero-th bit M0 is described.

As shown in a diagram at the top of FIG. 7, in an initial state before writing of data, a threshold voltage of a zero-th bit is lower than 0 V. As shown in the second diagram from the top of FIG. 7, a threshold voltage of a first bit M1, which is the memory element present in a position opposed to the zero-th bit M0 across the silicon pillar 20 is also lower than 0 V. As shown in a diagram at the bottom of FIG. 7, a threshold voltage of a second bit, which is the memory element 30 disposed spaced from the zero-th bit M0 in the Z-direction is also set lower than 0 V.

As a procedure of data writing in the zero-th bit M0, (1) strings Str(11) and Str(12) are selected, (2) the rough writing is executed on the first bit M1, (3) the rough writing is executed on the second bit M2, and (4) the fine writing is executed on the zero-th bit M0.

More specifically, the data writing is executed as described below.

(1) The string Str(11) and Str(12) including the zero-th bit M0 to the seventh bit M7 is selected. To select the string Str(11) and Str(12), the bit line BL(1) in the first row is selected. To select the bit line BL(1) in the first row, for example, 0 V is supplied to the bit line BL(1). Note that, for example, a power supply voltage of 2.5 V is applied to unselected bit lines BL (i≠1). To select any one of the string Str(11) and the string Str(12), the bit line BL(1) in the first row and the selection transistors 4da and 4db in the second column are selected. To select any one of the selection transistors 4da in the first column and 4db in the second column, for example, 2.5 V is supplied to either of selection line SDG(1) or SDG(2). Note that, in the writing mode, the selection transistors 4sa and 4sb are unselected. To unselect the selection transistors 4sa and 4sb, for example, 0 V is applied to SSG(1) and SSG(2).

(2) The selection transistor 4db is selected and Str(12) is selected. The first bit M1 disposed on a side opposed to the zero-th bit via the silicon pillar 20 is selected. To select the first bit M1, for example, 13 V is supplied to a word line WL1 of the first bit M1. To unselect the string Str(11) disposed in a position opposed to the first bit M1, the selection transistor 4da is unselected. To unselect the selection transistor 4da, for example, 0 V is applied to the selection line SDG(1). Vpass, which is an intermediate potential between the writing voltage and 0 V, is applied to word lines WL0, WL2, WL4, and WL6 of the zero-th bit M0, the second bit M2, the fourth bit M4, and the sixth bit M6.

In the other bits M3, M5, and M7 of the string Str(12) in which the first bit M1 is included, in order to form a channel on the plane 20b of the silicon pillar 20 and supply charges from the bit line BL(1) to the first bit M1, Vpass, which is the intermediate potential, is supplied to word lines WL3, WL5, and WL7. Vpass is, for example, 10 V.

For example, 12 V is applied to the word line of the first bit M1 as the initial writing voltage Vpgm. Subsequently, for example, a voltage of 5 V is applied to the word line of the first bit M1 to determine whether the initial writing voltage Vpgm exceeds the A level verify voltage (rough). When it is determined that the initial writing voltage Vpgm does not exceed the A level verify voltage (rough), the step-up voltage ΔVr of the rough writing is added to the initial writing voltage Vpgm. The new writing voltage added ΔVr is applied to the word line again to perform the writing again. When the initial writing voltage Vpgm exceeds the A level verify voltage (rough), the writing is not performed again. The step-up voltage ΔVr of the rough writing is, for example, 1 V. Therefore, when the threshold voltage does not exceeds the A level verify voltage (rough), for example, 13 V is applied to the word line WL1 of the first bit M1.

The operation described above is repeated until the threshold voltage exceeds the A level verify voltage (rough).

In this way, the rough writing is executed on the first bit M1 present in a position opposed to the zero-th bit M0.

(3) The selection transistor 4sb is unselected and the selection transistor 4sa is selected. Subsequently, the second bit M2 disposed adjacent to the zero-th bit M0 in the Z-direction is selected. To select the second bit M2, for example, 20 V is supplied to the word line WL2 of the second bit M2. The word lines WL1, WL3, WL5, and WL7 of the first, third, fifth, and seventh bits M1, M3, M5, and M7 disposed in positions opposed to the second bit M2 are connected to some potentials.

Vpass is supplied to the word lines WL0, WL4, and WL6 of the other bits M0, M4, and M6 of the string Str(11) in which the second bit M2 is included.

The word line WL2 of the second bit M2 is selected, the initial writing voltage Vpgm (12 V) is applied as in the case of the first bit M1, and, subsequently, the verify readout is executed. The verify readout is executed while the writing voltage applied to the word lines is increased by the step-up voltage ΔVr of the rough writing at a time. In this way, the rough writing is executed on the second bit M2.

(4) The selection transistor 4da is selected, the selection transistor 4sb is unselected, and, subsequently, the zero-th bit M0 is selected. To select the zero-th bit M0, for example, 13 V, which is Vpgm, is supplied to the word line WL0 of the zero-th bit M0. Vpass is connected to the word lines WL1, WL3, WL5, and WL7 of the first, third, fifth, and seventh bits M1, M3, M5, and M7 disposed in the positions opposed to the zero-th bit M0.

Vpass is supplied to the word lines WL2, WL4, and WL6 of the other bits M2, M4, and M6 of the string Str(11) to which the zero-th bit M0 belongs.

The word line WL0 of the zero-th bit M0 is selected and the initial writing voltage Vpgm is applied. The zero-th bit M0 performs the fine writing. Therefore, the writing voltage is increased by the step-up voltage ΔVf for the fine writing at a time to execute the verify readout. The step-up voltage ΔVf for the fine writing is, for example, 0.5 V.

In this way, data is written in the zero-th bit M0 by the fine writing. Note that, since the rough writing is executed on the first bit M1 present in the position opposed to the zero-bit M0, as indicated by a broken line in a fourth diagram from the top of FIG. 7, a threshold voltage of the zero-th bit M0 is affected by the first bit M1 and tends to shift to be higher but hardly changes. A threshold voltage of the zero-th bit M0 is affected by a proximity effect of the second bit M2 adjacent thereto and tends to shift to be higher as indicated by an alternate long and short dash line but hardly changes.

(5) After the fine writing of the zero-th bit M0 ends, the fine writing is executed on the first bit M1 present in the position opposed to the zero-th bit M0. Note that, before the fine writing of the first bit M1 is executed, the rough writing is executed on the third bit M3 adjacent to the first bit M1.

(6) After the fine writing of the first bit ends, the fine writing is executed on the second bit M2 adjacent to the zero-th bit M0. Note that, before the fine writing of the second bit M2 is executed, the rough writing is executed on the fifth bit M5 present in a position adjacent to the second bit M2.

In this way, concerning the other bits, in the same manner, the rough writing is sequentially executed on the bits present in positions opposed to bits, in which the fine writing is executed, via the silicon pillar 20. After the rough writing is executed on the bits adjacent in the Z-direction, the fine writing is executed on the bits.

FIG. 8 is a diagram showing a procedure of the writing of all the memory elements 30 formed in the same silicon pillar 20. In a leftmost column in FIG. 8, items of all procedures including the procedures of (1) to (6) above are listed in time series. Procedures corresponding to (1) to (6) above are also described in the diagram. Procedures after (1) to (6) are as described below.

(7) The fine writing is executed on the third bit M3. Before the fine writing is executed on the third bit M3, the rough writing is executed on the fifth bit M5 adjacent to the third bit M3. Note that, concerning the second bit M2 opposed to the third bit M3, since the fine writing is already executed, the rough writing is not redundantly executed. This is because, if the writing operation is redundantly executed on the memory element on which the fine writing is executed, a threshold voltage during readout shifts to a higher voltage.

(8) The fine writing is executed on the fourth bit M4. Before the fine writing is executed on the fourth bit M4, the rough writing is executed on the sixth bit M6 adjacent to the fourth bit M4. Note that, concerning the fifth bit M5 opposed to the fourth bit M4, the rough writing is already executed.

(9) The fine writing is executed on the fifth bit M5. Before the fine writing is executed on the fifth bit M5, the rough writing is executed on the seventh bit M7 adjacent to the fifth bit M5. Note that, concerning the fourth bit opposed to the fifth bit M5, the fine writing is already executed.

(10) The fine writing of the sixth bit M6 is executed.

(11) The fine writing of the seventh bit M7 is executed.

In the fine writing of the sixth and seventh bits M6 and M7, the fine writing is already executed on both of the bits in opposed positions and the bits in the adjacent positions in the preceding procedure. Therefore, it is possible to execute the fine writing without waiting for the execution of the rough writing.

Note that the above operations are described as an example of operations for the four layers M1 to M7. However, it is possible to repeatedly apply the same procedure to an array including a larger number of layers.

A principle of the operation method for the memory device of the embodiment is described.

It is known that a threshold voltage of an SOI-type MOS transistor formed on an SOI substrate changes according to a bias state of a back gate side. In FIG. 9A, a graph is shown in which a relation between a gate voltage VG and a drain current ID on a MOS transistor side is plotted with a voltage on a back gate side set as a parameter. When a voltage on the back gate side is high, the MOS transistor falls into a complete depletion state in which an entire SOI region is depleted. The MOS transistor cannot be turned off unless a minus voltage is applied to a front gate electrode of the MOS transistor (an "A" region and an "a" region). As shown in FIG. 9B, in a "B" region of FIG. 9A, a depletion layer width Dbg changes according to a bias voltage on the back gate side. Therefore, curves of energy levels Ec and Ev of a conduction band and a valence band are larger as the voltage on the back gate side is higher. Therefore, an energy level on the MOS transistor side is also curved. A depletion layer width Dfg changes. The threshold voltage on the front gate side of the MOS transistor changes. When a minus voltage having a sufficiently large absolute value is applied to the back gate side, a back gate oxide film interface side changes to an accumulation state. Therefore, the threshold of the MOS transistor on the front gate side takes a substantially fixed value irrespective of the applied voltage on the back gate side (a "C" region).

Therefore, if a channel of the memory element on the opposed plane is in the accumulation state in advance, the writing target memory element is not affected by a voltage shift of the threshold voltage during the readout.

A comparative example is described. In a semiconductor memory device in the comparative example, a circuit configuration is the same as the circuit configuration of the semiconductor memory device 1 of the embodiment described above (FIGS. 4 to 6). A procedure of writing in the memory device is different. Therefore, explanation is omitted concerning the circuit configuration.

As shown in FIG. 11, as in the semiconductor memory device 1 of the embodiment, in the memory device in the comparative example, in the initial state, the zero-th bit M0 to the second bit M2 are in the E level. Concerning procedures same as the procedures of the operation method for the memory device of the embodiment, explanation is omitted as appropriate.

(1') The strings Str(11) or Str(12) including the zero-th bit M0 to the seventh-bit M7 is selected.

(2') After the string Str(11) is selected, in order to select the zero-th bit M0 to write data, for example, 13 V is supplied to the word line WL0 of the zero-th bit. After a verify operation of the zero-th bit M0 is executed, a threshold voltage of the zero-th bit M0 exceeds 0 V and indicates a distribution in a narrow range as indicated by a solid line at the top of FIG. 11.

(3') After the string Str(11) is unselected and the string Str(12) is selected, in order to select the first bit M1 to write data, for example, 13 V is supplied to the word line WL1.

After the verify operation is performed, distribution of threshold voltages of the first bit M1 indicates a narrow range as indicated by a broken line in a fifth diagram from the top in FIG. 11. However, before data is written in the first bit M1, the plane 20b of the silicon pillar 20, on which the first bit M1 is formed, is in an inversion state. When the data is written in the first bit M1, the plane 20b of the silicon pillar 20 changes to the accumulation state and the threshold voltage of the zero-th bit M0 present in the opposed position of the first bit M1, that is, on the side of the plane 20a of the silicon pillar 20 rises from the initial value. Therefore, the distribution of the threshold voltages of the zero-th bit M0 shifts to a higher side as indicated by a broken line in a fourth diagram from the top in FIG. 11.

(4') In order to select the second bit M2 to write data, for, example, a voltage of 13 V is supplied to the word line WL2 of the second bit M2. After the verify operation is executed, a threshold voltage of the second bit M2 exceeds 0 V and indicates distribution in a narrow range as indicated by an alternate long and short dash line at the bottom in FIG. 11. In this case, the threshold voltage of the memory element of the zero-th bit M0 shifts to be higher as indicated by an alternate long and short dash line in the fourth diagram from the top in FIG. 11 because of the proximity effect (cell-to cell interference). In an extreme case, the threshold voltage exceeds the verify level of the B level or the C level, substantially changes to another level, and causes data corruption.

In this way, in the case of memory elements 30a and 30b respectively formed on the opposed planes 20a and 20b of the silicon pillar 20 having the silicon pillar 20 in common, after data is written in the writing target memory element, when data is written in the memory element on the opposed plane, the channel on the opposed plane changes from the inversion state to the accumulation state. Therefore, the threshold voltage of the writing target memory element shifts to be higher. Further, when data is written in the memory element adjacent to the writing target memory element, the threshold voltage further shifts to be higher.

On the other hand, in the memory device of the embodiment, the opposed plane can be changed to the accumulation state by writing data in advance in the memory element on the opposed plane of the writing target memory element. Therefore, the threshold voltage of the writing target memory element hardly shifts. Data is also written in the adjacent memory element. Therefore, the threshold voltage is less easily affected by the proximity effect. Writing in the memory element on the opposed plane and the adjacent memory element is executed first by the rough writing in which the step-up voltage ΔVr is large. Thereafter, the writing is executed by the fine writing in which the step-up voltage ΔVr is small. Therefore, writing procedures do not increase and time required for the writing does not increase.

By arraying the memory elements in the order of the writing target memory element, the memory element in the position opposed to the writing target memory element via the silicon pillar 20, and the memory element adjacent to the writing target memory element in the Z-direction, the memory element strings having the silicon pillar 20 in common can be pages belonging to the same block. Allocation of the pages can be easily performed.

As described above, in the semiconductor memory device 1 of the embodiment, by executing the data writing of the writing target memory element after executing the rough writing on the memory element on the opposed plane, it is possible to dispose the memory elements on the surface having the silicon pillar in common and opposed to each other. Therefore, it is unnecessary to form a region for separating the silicon pillar for each opposed plane. It is possible to improve bit density. Since a separation process for the silicon pillar is unnecessary, the number of processes is reduced and processing is facilitated.

By executing the data writing of the writing target memory element after executing the rough writing on the memory element adjacent to the writing target memory element, the date writing is less easily affected by shift in a threshold due to the proximity effect. Therefore, since it is possible to reduce a pitch of arrangement of the memory elements, it is possible to further improve the bit density.

A manufacturing method for the semiconductor memory device 1 according to the embodiment is subsequently described.

FIGS. 12A to 23A are sectional views illustrating a manufacturing method for the memory device according to the embodiment.

FIGS. 12B to 23B are respectively sectional views taken along line A-A' in FIGS. 12A to 23A.

Figure 23B:
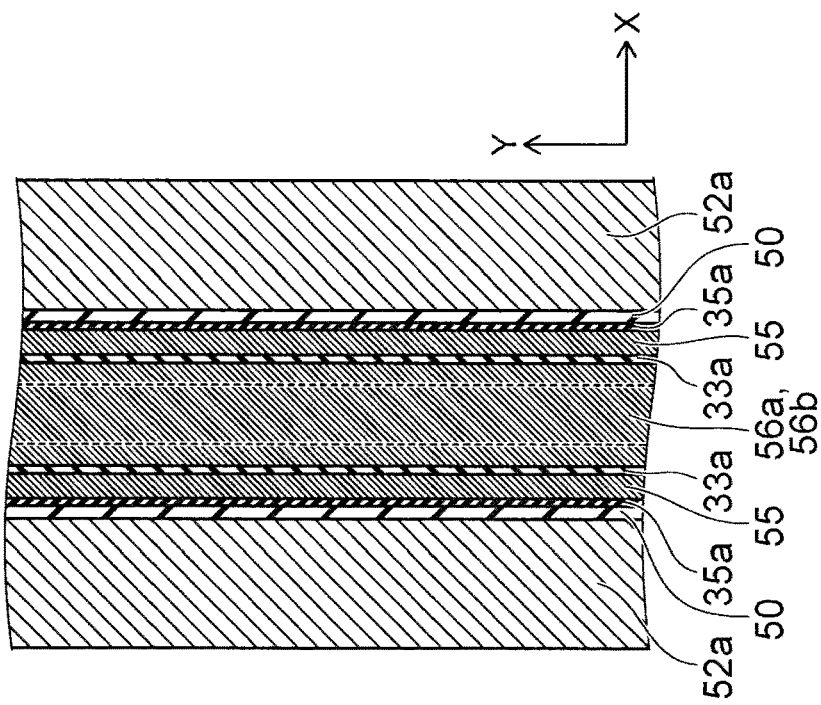
FIG. 23B is a sectional view taken along line A-A' in FIG. 23A.

FIGS. 24A to 24D are sectional views illustrating the manufacturing method for the memory device according to the first embodiment and show a cross section corresponding to FIG. 23B.

Figure 25:
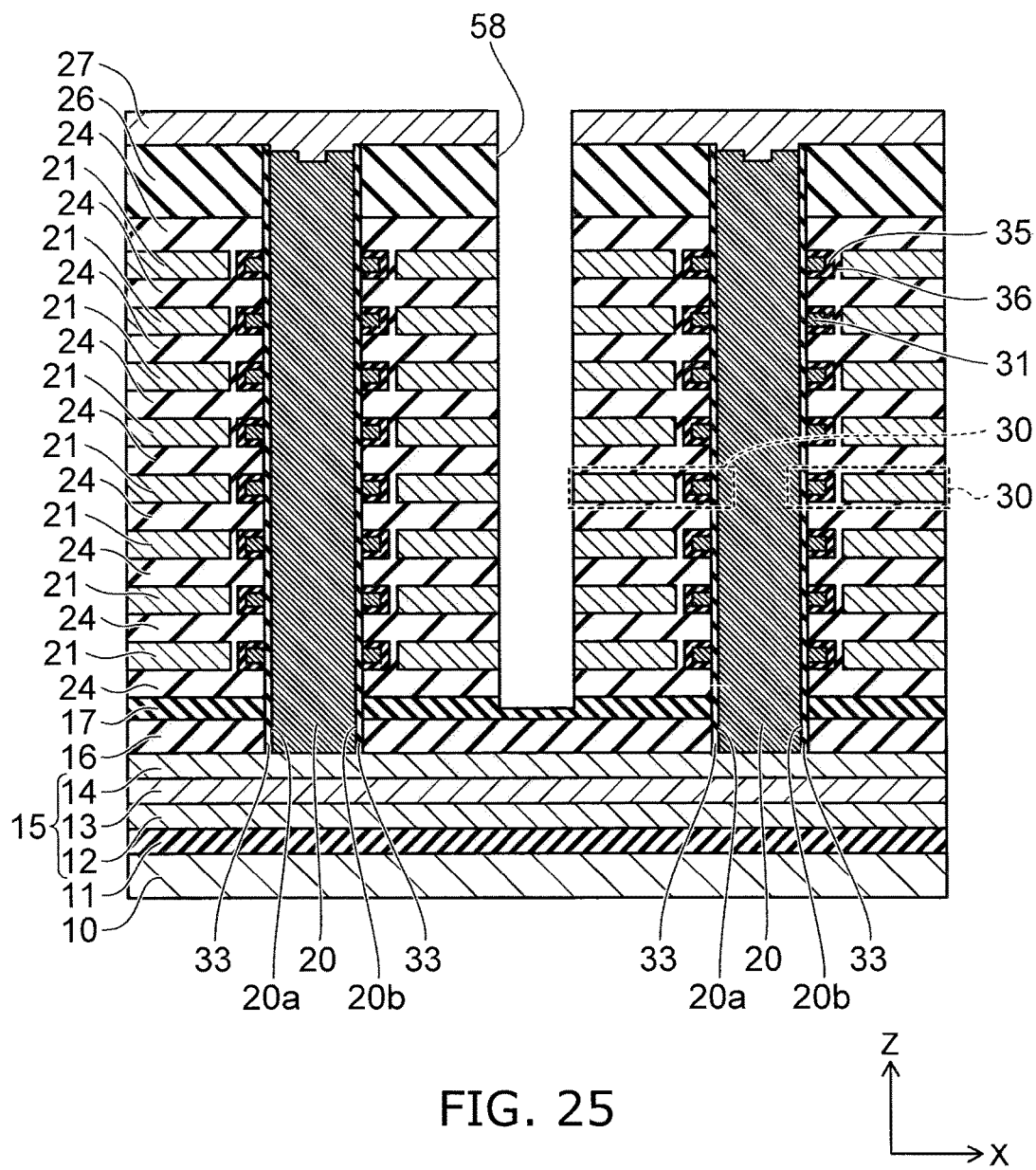
FIG. 25 is a sectional view illustrating the manufacturing method for the memory device according to the first embodiment.

FIG. 25 is a sectional view illustrating the manufacturing method for the memory device according to the first embodiment.

Figure 26:
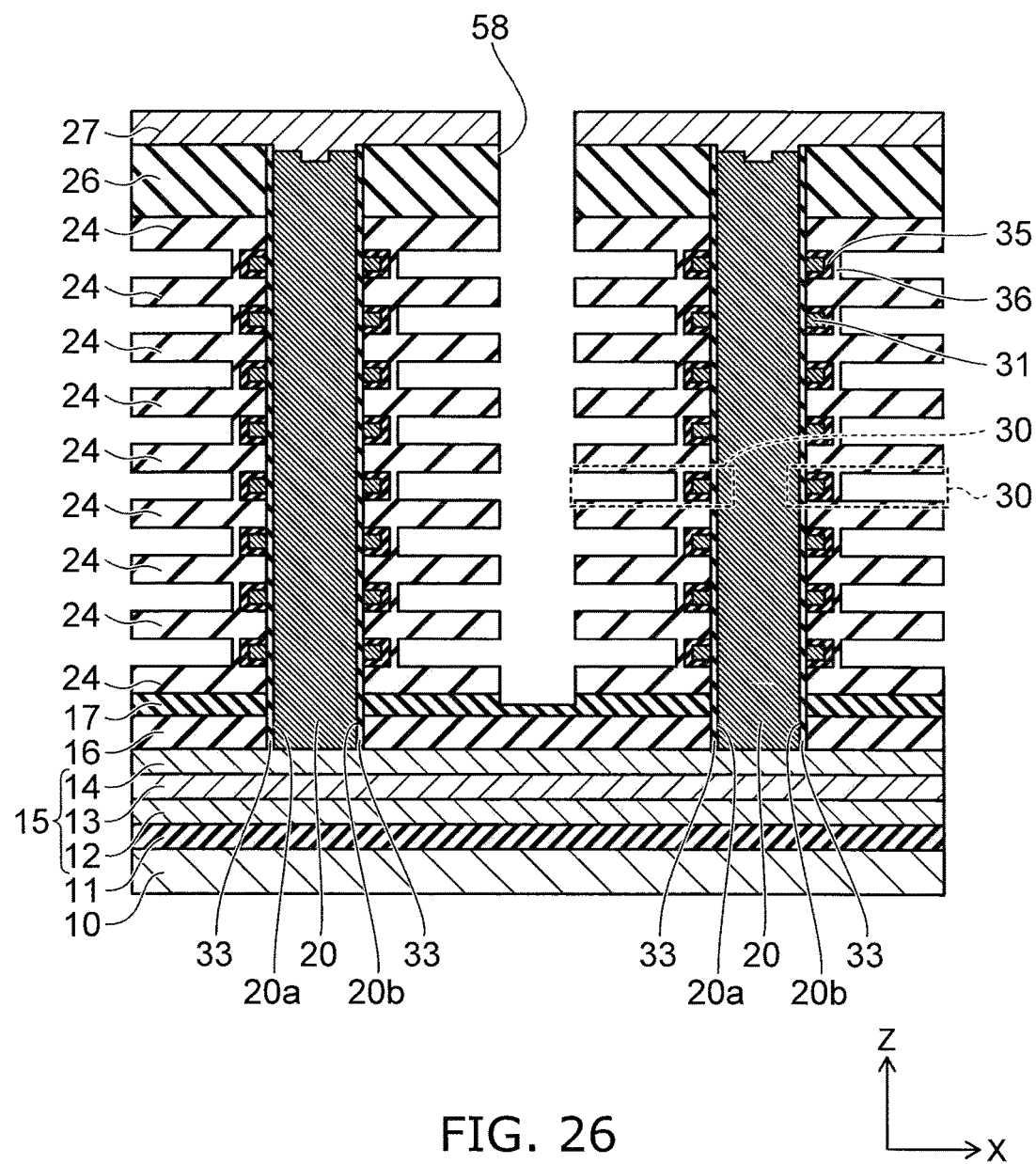
FIG. 26 is a sectional view illustrating the manufacturing method for the memory device according to the first embodiment.

FIG. 26 is a sectional view illustrating the manufacturing method for the memory device according to the first embodiment.

Figure 27:
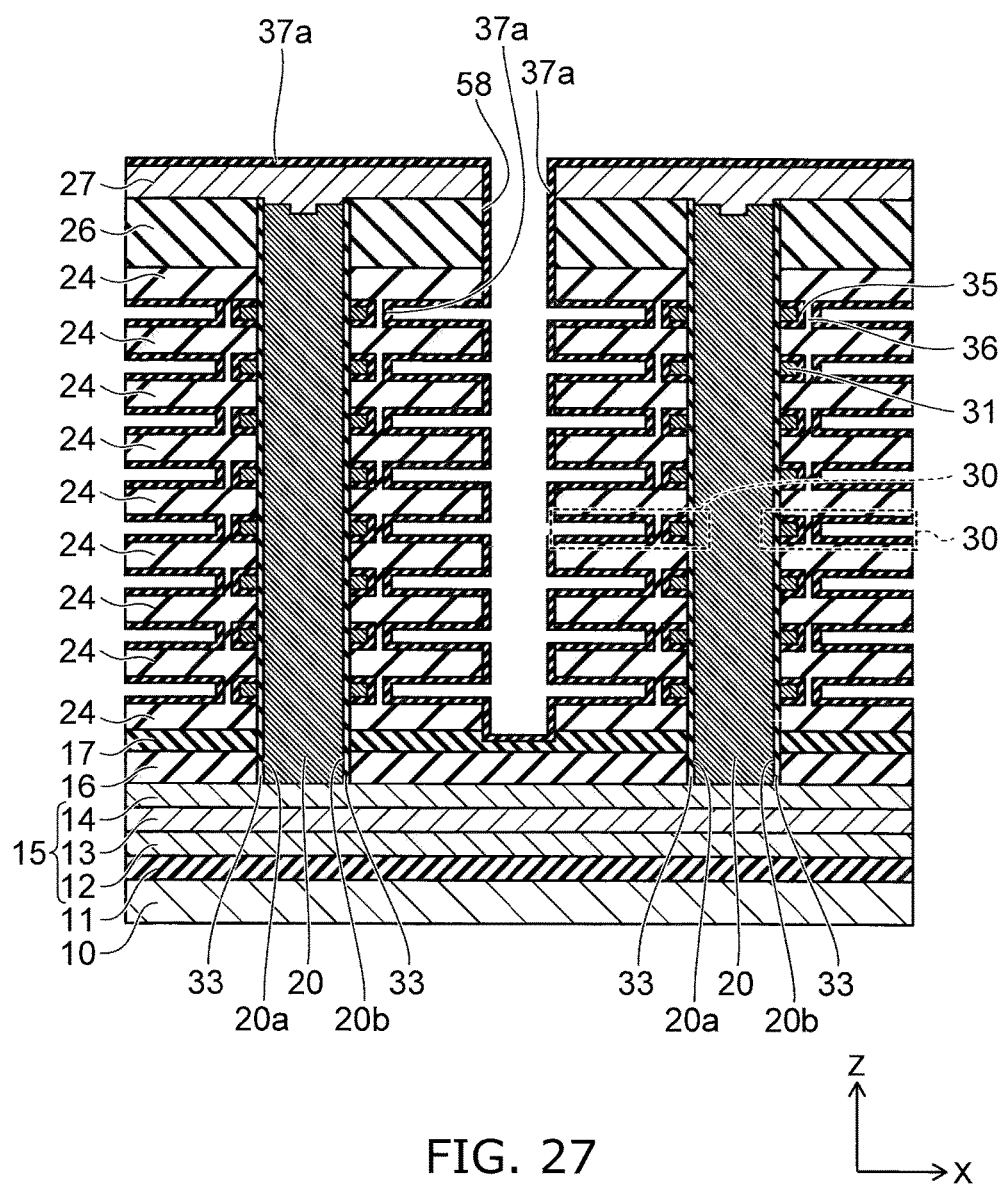
FIG. 27 is a sectional view illustrating the manufacturing method for the memory device according to the first embodiment.

FIG. 27 is a sectional view illustrating the manufacturing method for the memory device according to the first embodiment.

Figure 28:
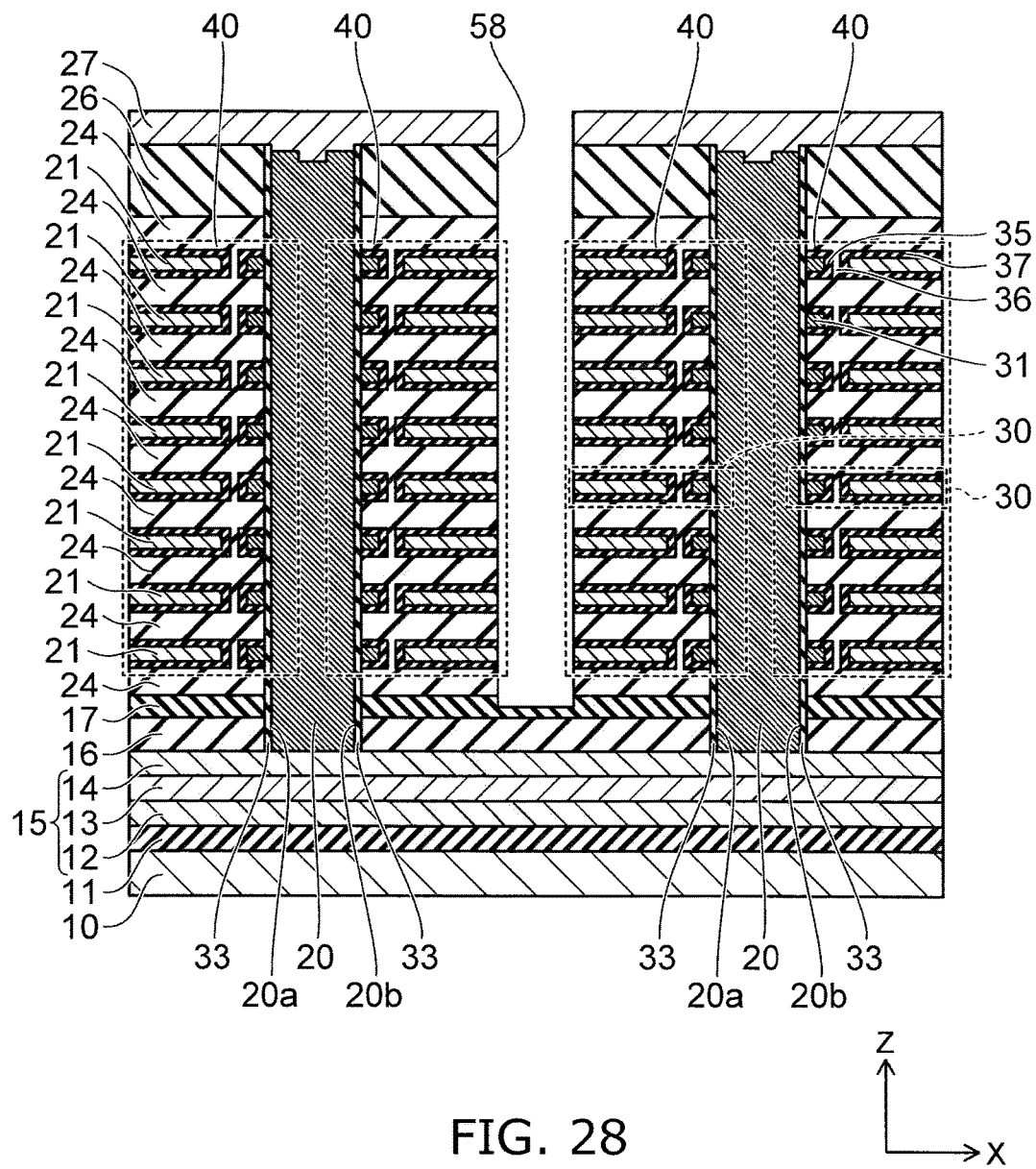
FIG. 28 is a sectional view illustrating the manufacturing method for the memory device according to the first embodiment.

FIG. 28 is a sectional view illustrating the manufacturing method for the memory device according to the first embodiment.

Figure 12B:
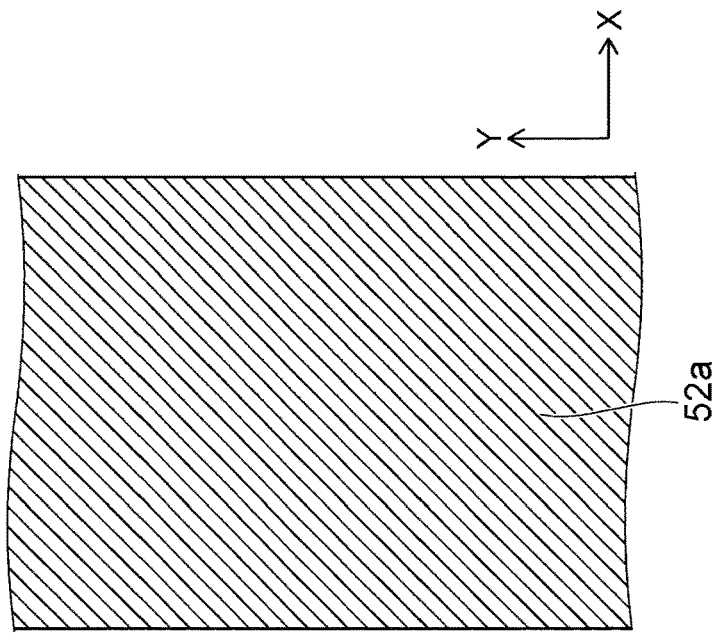
FIG. 12B is a sectional view taken along line A-A' in FIG. 12A.
Figure 12A:
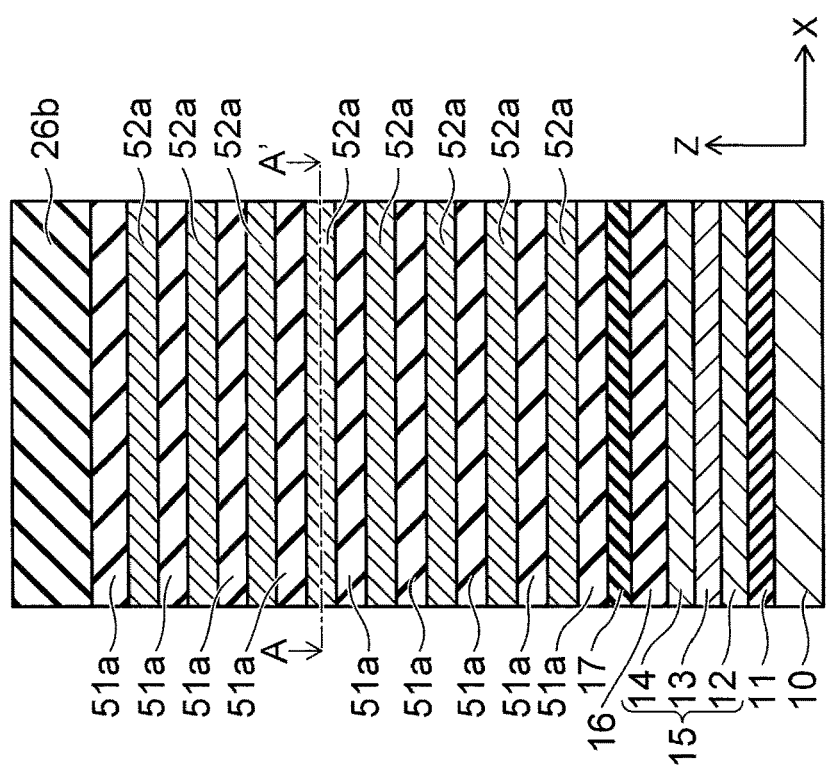
FIG. 12A is a sectional view illustrating a manufacturing method for the memory device according to the first embodiment.

As shown in FIGS. 12A and 12B, the cell source line 15 including the conductive layer 12, the interconnection layer 13, and the conductive layer 14 is formed on the insulating layer 11 formed on the upper surface 10a of the silicon substrate 10. The insulating layers 16 and 17 are formed and then a plurality of silicon oxide films 51 and polysilicon films 52a are stacked. A hard mask 26b is formed on a silicon oxide film 51a of the top layer. The hard mask 26b is formed of, for example, a silicon nitride film.

As shown in FIGS. 13A and 13B, the hard mask 26b is patterned. A trench 53 is formed in the stacked body with the patterned hard mask 26b as a mask using an anisotropic etching technology such as reactive ion etching (RIE). The trench 53 is opened to reach the conductive layer 14 piercing through the insulating layers 16 and 17. The trench 53 is opened in a rectangular shape, the long side of which extends in the Y-direction.

As shown in FIGS. 14A and 14B, wet etching is applied to recess the polysilicon films 52a exposed to the side surface of the trench 53. Recessed sections 54 are formed in regions corresponding to the polysilicon films 52a on the side surface of the trench 53. The recessed sections 54 are formed to surround the trench 53 in the respective polysilicon films 52a.

As shown in FIGS. 15A and 15B, oxidation treatment is applied to the whole surface including the recessed surface using an SPA (Slot Plane Antenna) technique or the like. End faces of the polysilicon films 52a exposed by the recess are covered with a thin silicon oxide layer 50. Note that a part of the silicon oxide layer 50 finally becomes the silicon oxide layer 36 that forms the block insulating film 34.

Figure 16B:
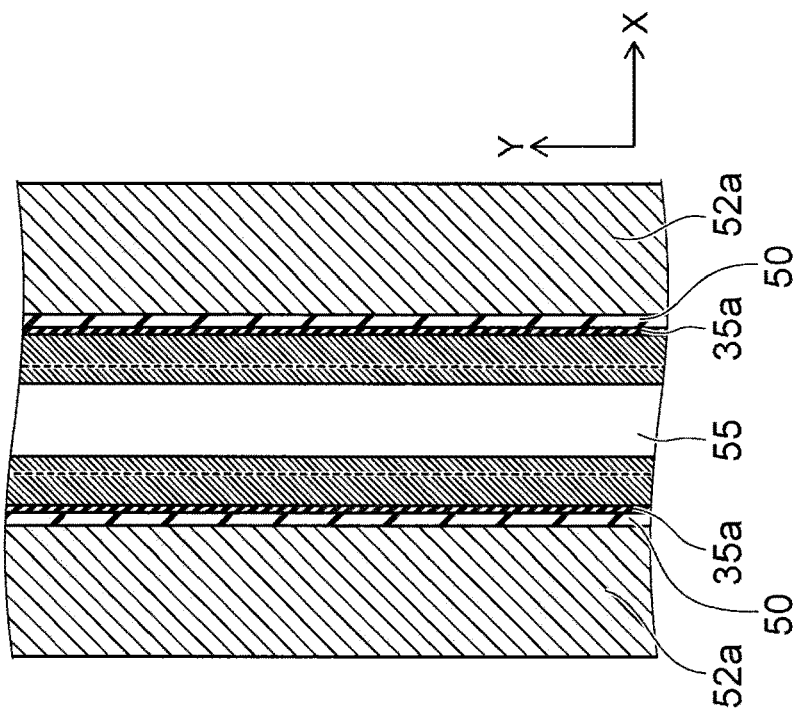
FIG. 16B is a sectional view taken along line A-A' in FIG. 16A.
Figure 16A:
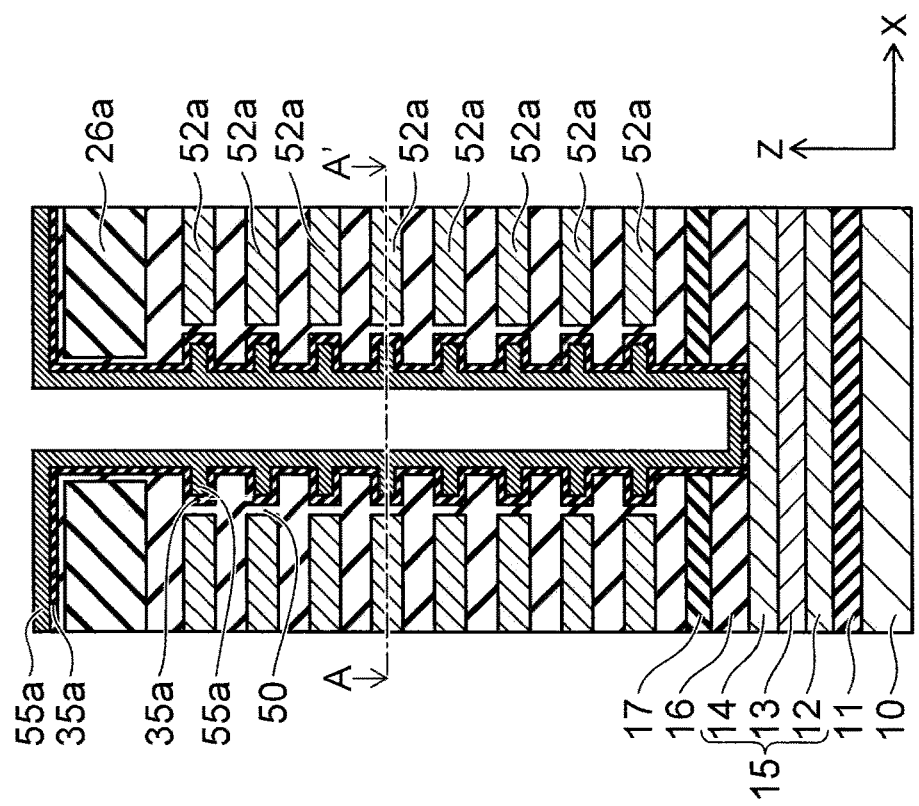
FIG. 16A is a sectional view illustrating a manufacturing method for the memory device according to the first embodiment.

As shown in FIGS. 16A and 16B, a silicon nitride layer 35a is formed over the entire surface. A polysilicon film 55a is formed on the silicon nitride layer 35a by the CVD or the like. Note that a part of the silicon nitride layer 35a finally becomes the silicon nitride layer 35 that forms the block insulating film 34.

As shown in FIGS. 17A and 17B, the anisotropic etching such as the RIE is applied along the trench 53 to selectively remove the polysilicon film 55a and leave a polysilicon films 55 in the recessed sections 54. Therefore, the polysilicon films 55 remaining in the recessed sections 54 adjacent to each other are divided from each other in the Z-direction. Note that the polysilicon films 55 remaining in the recessed sections 54 finally becomes the floating gate electrode films 31.

As shown in FIGS. 18A and 18B, the anisotropic etching such as the RIE is performed. Consequently, the silicon nitride layer 35a formed on the side surface and the bottom surface of the trench 53 is selectively removed. The silicon nitride layers 35 remaining in the recessed sections 54 adjacent to each other in the Z-direction become a layer that forms the block insulating film 34.

As shown in FIGS. 19A and 19B, a silicon oxide film 33a is formed to cover the entire surface including the side surface and the bottom surface of the trench 53. Further, a polysilicon film 56a is deposited on the silicon oxide film 33a. Note that the silicon oxide film 33a finally becomes the tunnel insulating film 33. Since the polysilicon film 56a deposited provides the surface side of the silicon pillar 20, an applied bias voltage of one side shifts the threshold of the memory element 30 on the other side. Therefore, the polysilicon film 56a is desirably formed of doped polysilicon in which p-type impurities are introduced to suppress the threshold voltage shift.

As shown in FIGS. 20A and 20B, the silicon oxide film 33a and the polysilicon film 56a deposited on the bottom of the trench 53 are removed until the conductive layer 14 is exposed by the anisotropic etching such as the RIE.

As shown in FIGS. 21A and 21B, a polysilicon film 56b is deposited over the entire surface. A lower part of the polysilicon film 56b is connected to the conductive layer 14. Note that the polysilicon films 56a and 56b are formed of undoped polysilicon or p-type doped polysilicon and finally becomes the silicon pillar 20. In order to maintain the accumulation state of the surface of the silicon pillar 20 during readout of data, the polysilicon film 56a on the outer side may be formed of the p-type doped polysilicon and the inner side polysilicon film 56b may be formed as an undoped polysilicon film including acceptor defects. Alternatively, both of the polysilicon films 56a and 56b may be formed as p-type doped polysilicon films.

As shown in FIGS. 22A and 22B, the polysilicon film 56b on the upper surface is removed by the RIE or the like.

Figure 23A:
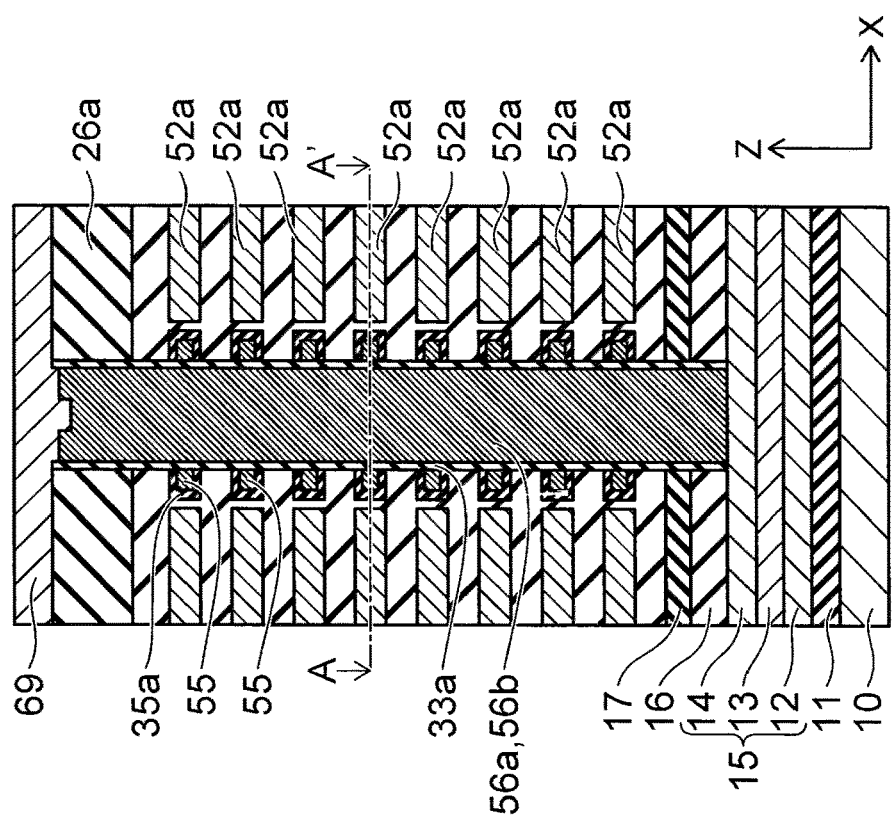
FIG. 23A is a sectional view illustrating a manufacturing method for the memory device according to the first embodiment.

As shown in FIGS. 23A and 23B, a polysilicon layer 69 is deposited over the entire surface by the CVD or the like. Note that the polysilicon layer 69 finally becomes the interconnect 27.

Figure 24A:
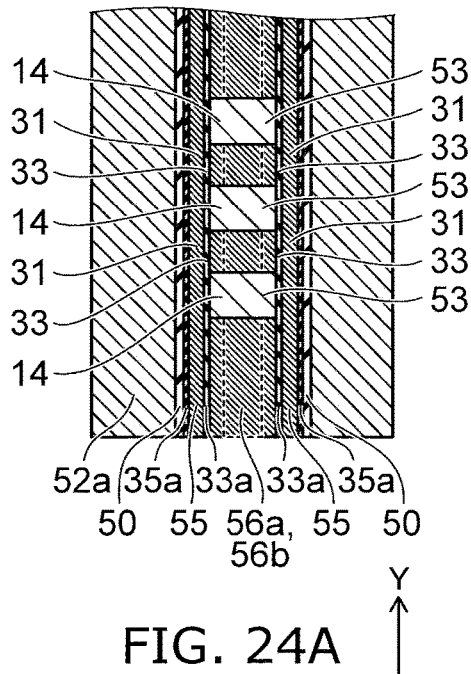
FIG. 24A is a sectional view illustrating the manufacturing method for the memory device according to the first embodiment and show a cross section corresponding to FIG. 23B.

As shown in FIG. 24A, in order to form the memory element strings 40 arrayed in the Y-direction, the polysilicon film 56b is divided along the Y-direction.

Figure 24B:
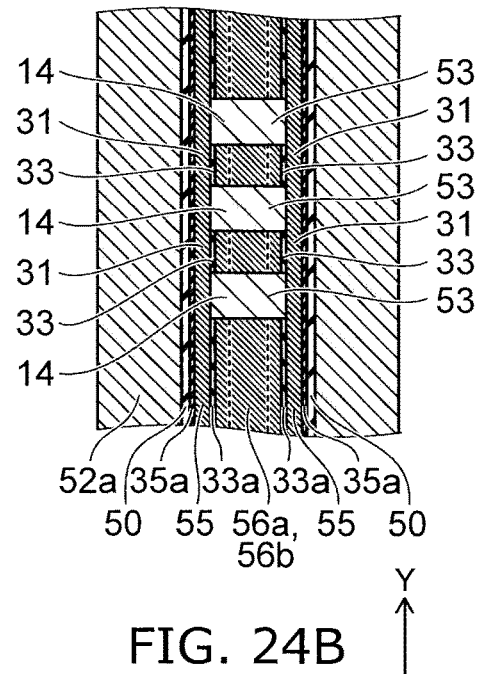
FIG. 24B is a sectional view illustrating the manufacturing method for the memory device according to the first embodiment and show a cross section corresponding to FIG. 23B.

As shown in FIG. 24B, the silicon oxide film 33a is divided by the wet etching or the like.

Figure 24C:
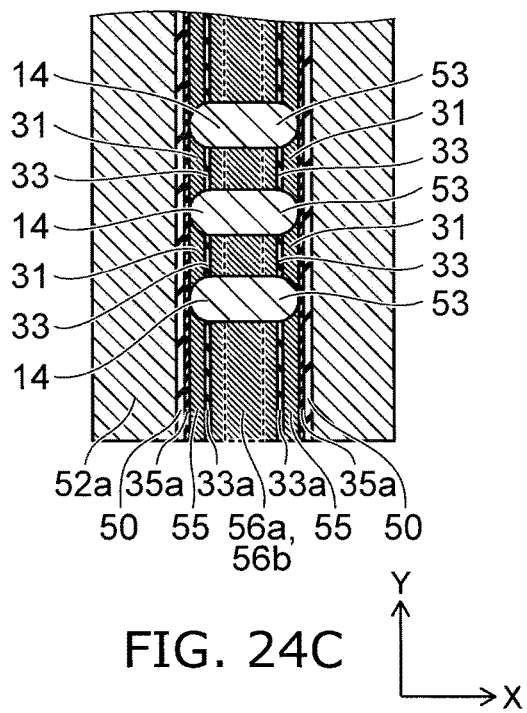
FIG. 24C is a sectional view illustrating the manufacturing method for the memory device according to the first embodiment and show a cross section corresponding to FIG. 23B.

As shown in FIG. 24C, the polysilicon film is divided by the wet etching or the like to form the floating gate electrode films 31. In this case, the centers of exposed surfaces of the polysilicon films 56a and 56b are more preferentially etched than the ends of the exposed surfaces. Therefore, the floating gate electrode films 31 are formed in a fan shape. The length of the floating gate electrode films 31 opposed to the control gate electrode film 21 side can be set longer than the length of the floating gate electrode films 31 opposed to the silicon pillar 20 side.

Figure 24D:
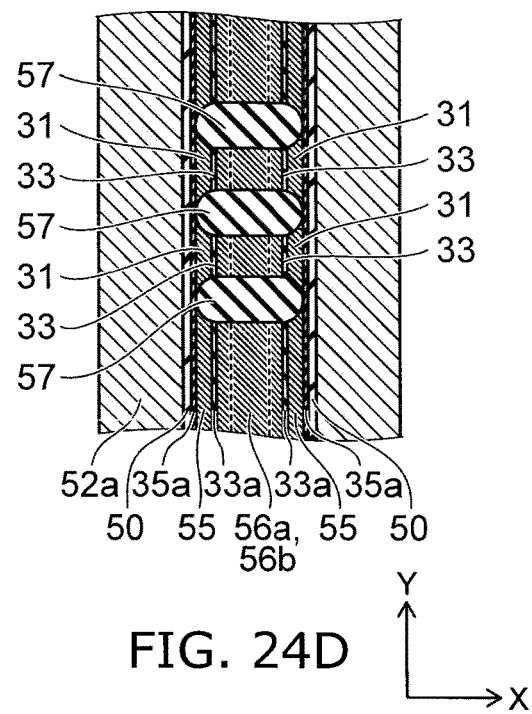
FIG. 24D is a sectional view illustrating the manufacturing method for the memory device according to the first embodiment and show a cross section corresponding to FIG. 23B.

As shown in FIG. 24D, insulating layers 57 are formed in air gaps 53 formed by the dividing processing.

As shown in FIG. 25, between the trenches 53 filled with the polysilicon films 56a and 56b, that is, between the silicon pillars 20 adjacent to each other, a trench 58 reaching the insulating layer 17 is formed by patterning the hard mask 26a. Like the trench 53, the trench 58 is formed in a rectangular shape, the long side of which extends in the Y-direction.

As shown in FIG. 26, by applying the wet etching using a hot TMY solution, the polysilicon films 52a are recessed via the trench 58.

As shown in FIG. 27, a silicon nitride layer 37a is formed over the entire surface. The silicon nitride layer 37a finally becomes the silicon nitride layer 37 that forms the block insulating film 34. Thereafter, as shown in FIG. 28, W or the like is deposited over the entire surface and unnecessary W is removed to form the control gate electrode films 21. After the trench 58, from which W is removed, is filled with the insulating layer 57, an inter-layer insulating layer is formed. The vias 28 are opened in the inter-layer insulating layer 23. An electrode material is filled in the each via 28. Thereafter, the bit line 29 is formed to complete the structure shown in FIG. 3A.

The manufacturing process described above is not limited to the order described above. For example, the process for forming the trench 58 and separating the control gate electrode film 21 for the respective memory element strings 40 may be carried out before the process for dividing the silicon pillar 20. Alternatively, the process for dividing the silicon pillar 20 may be executed after the control gate electrode film forming process.

According to the embodiment described above, it is possible to make the semiconductor memory device including the silicon pillar 20 provided between the memory element strings 40 disposed to be opposed to each other.

Second Embodiment

Figure 29:
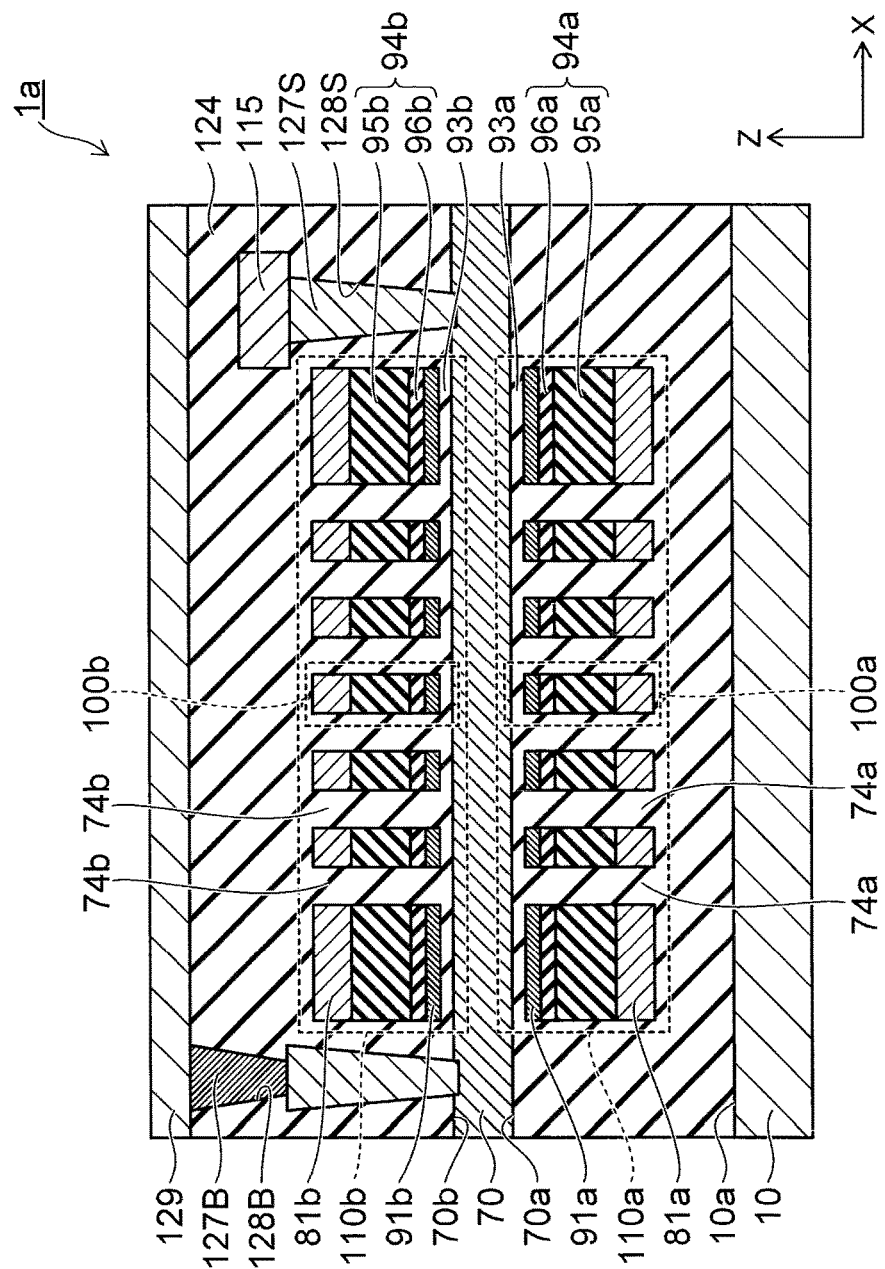
FIG. 29 is a sectional view illustrating the memory device according to a second embodiment.

FIG. 29 is a sectional view illustrating a memory device according to a second embodiment.

Figure 30:
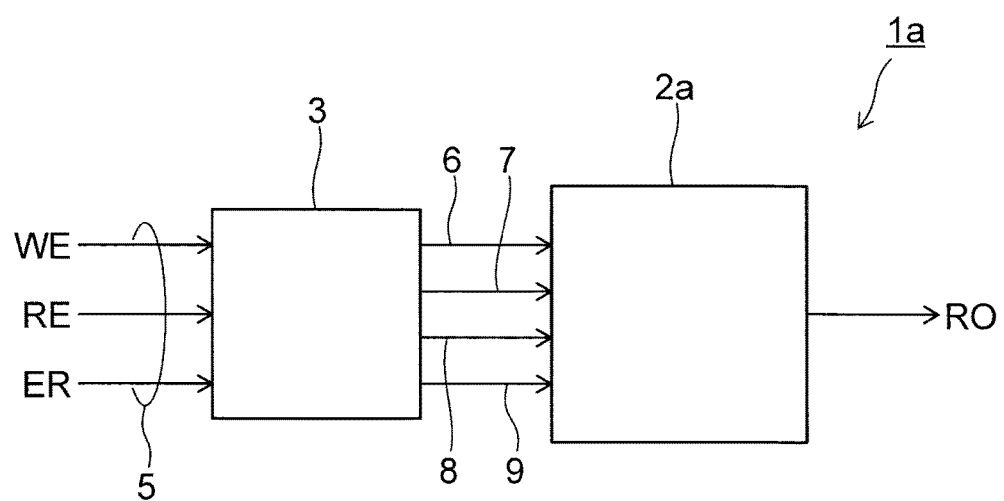
FIG. 30 is a block diagram illustrating the memory device according to the second embodiment.

FIG. 30 is a block diagram illustrating the memory device according to the second embodiment.

In the above description, the semiconductor memory device including the memory element strings 40 formed on the sides of the silicon pillar 20 extending in the up down direction with respect to the silicon substrate is described. However, the semiconductor memory device may include a semiconductor layer in which a channel is formed along a direction parallel to the silicon substrate.

As shown in FIG. 29, a semiconductor memory device 1a in the second embodiment includes the silicon substrate 10 having the upper surface 10a and semiconductor layers 70 extending in the X-direction substantially in parallel to the upper surface 10a of the silicon substrate 10 and having lower surfaces 70a and upper surfaces 70b. The semiconductor layers 70 are disposed spaced in the Y-direction (not shown in the figure) and provided separated from the upper surface 10a of the silicon substrate 10 in the Z-direction. The semiconductor memory device is includes a plurality of control gate electrode layers 81a disposed separated from one another in the X-direction between the silicon substrate 10 and the lower surfaces 70a of the semiconductor layers 70. The semiconductor memory device is includes floating gate electrode layers 91a provided between the lower surfaces 70a of the semiconductor layers 70 and the control gate electrode layers 81a. The semiconductor memory device 1a includes tunnel insulating layers 93a provided between the lower surfaces 70a of the semiconductor layers 70 and the floating gate electrode layers 91a. The semiconductor memory device 1a includes block insulating layers 94a provided between the floating gate electrode layers 91a and the control gate electrode layers 81a.

The control gate electrode layers 81a are divided from one another in the X-direction by insulating layers 74a. The control gate electrode layers 81a divided in the X-direction extend in the Y-direction and cross the semiconductor layers 70 disposed substantially in parallel to the Y-direction. Therefore, crossing points of the semiconductor layers 70 and the control gate electrode layers 81a are arrayed in a matrix shape on the XY plane.

The floating gate electrode layers 91a are disposed to divide from one another in the X-direction and the Y-direction at the respective crossing points of the semiconductor layers 70 and the control gate electrode layers 81a.

The tunnel insulating layers 93a are formed over the entire lower surfaces 70a of the semiconductor layers 70.

The block insulating layers 94a are two-layer films including first insulating layers 95a made of, for example, a silicon oxide and second insulating layers 96a made of, for example, a silicon nitride. In the block insulating layers 94a, the first insulating layers 95a and the second insulating layers 96a are stacked in this order from the floating gate electrode layers 91a to the control gate electrode layers 81a. The block insulating layers 94a are formed to divide from one another in the X-direction and the Y-direction at the respective crossing points of the semiconductor layers 70 and the control gate electrode layers 81a.

In this way, memory elements 100a are formed by stacking, from the upper surface 10a of the silicon substrate 10, the control gate electrode layers 81a, the second insulating layers 96a, the first insulating layers 95a, the floating gate electrode layers 91a, the tunnel insulating layers 93a, and the semiconductor layers 70 in this order. The memory elements 100a are formed in a matrix shape in the X-direction and the Y-direction at the respective crossing points of the semiconductor layers 70 and the control gate electrode layers 81a.

Memory element strings 110a include a plurality of memory elements having the semiconductor layers 70 in common and arrayed in the X-direction. At both ends in the X-direction of the memory element strings 110a, insulating layers are formed. Insulating layers are formed between the memory element strings 110a and the silicon substrate 10.

The semiconductor memory device 1a includes control gate electrode layers 81b provided spaced from the upper surfaces 70b of the semiconductor layers 70 upward in the Z-direction and spaced from one another in the X-direction. The semiconductor memory device 1a includes floating gate electrode layers 91b between the upper surfaces 70b of the semiconductor layers 70 and the control gate electrode layers 81b. The semiconductor memory device 1a includes tunnel insulating layers 93b provided between the upper surfaces 70b of the semiconductor layers 70 and the floating gate electrode layers 91b. The semiconductor memory device is includes block insulating layers 94b provided between the floating gate electrode layers 91b and the control gate electrode layers 81b.

The control gate electrode layers 81b are divided from one another in the X-direction by insulating layers 74b. The control gate electrode layers 81b divided in the X-direction extend in the Y-direction and cross the semiconductor layers 70 disposed in the Y-direction. Therefore, crossing points of the semiconductor layers 70 and the control gate electrode layers 81b are arrayed in a matrix shape on the XY plane.

The floating gate electrode layers 91b are disposed to be divided from one another in the X-direction and the Y-direction at the respective crossing points of the semiconductor layers 70 and the control gate electrode layers 81b.

The tunnel insulating layers 93b are formed over the entire upper surfaces 70b of the semiconductor layers 70.

The block insulating layers 94b are two layer films including first insulating layers 95b made of, for example, a silicon oxide and second insulating layers 96b made of, for example, a silicon nitride. The first insulating layers 95b and the second insulating layers 96b are stacked in this order from the floating gate electrode layers 91b to the control gate electrode layers 81b. The block insulating layers 94b are formed to divide from one another in the X-direction and the Y-direction at the respective crossing points of the semiconductor layers 70 and the control gate electrode layers 81b.

In this way, in memory elements 100b, the tunnel insulating layers 93b, the floating gate electrode layers 91b, the first insulating layers 95b, the second insulating layers 96b, and the control gate electrode layers 81b are stacked in this order from the upper surfaces 70b of the semiconductor layers 70. The memory elements 100b are formed in a matrix shape in the X-direction and the Y-direction at the respective crossing points of the semiconductor layers 70 and the control gate electrode layers 81b. Insulating layers 74b are formed among the memory elements 100b adjacent to one another. In this way, the memory elements 100b have the semiconductor layers 70 in common and are arrayed in the X-direction. Memory element strings 110b extending in the X-direction are formed. At both ends in the X-direction of the memory element strings 110b, insulating layers are formed.

The memory elements 100b forming the memory element strings 110b are respectively disposed in positions opposed to, in the Z-direction, the memory elements 100a that forms the memory element strings 110a. Therefore, the memory element strings 110a and 110b are formed having the semiconductor layers 70 in common and are disposed to be opposed to each other across the semiconductor layers 70. In other words, the semiconductor layers 70 are provided between the two memory elements 100a and 100b and used in common by the two memory elements 100a and 100b.

A cell source line 115 is formed to extend in the Y-direction above the memory element strings 110b. Inter-layer insulating layers 124 are formed between the memory element strings 110b and the cell source line 115. Inter-layer insulating layers 124 are formed between the semiconductor layers 70 and the cell source line 115. Vias 128S filled with conductive layers 127S are formed in the inter-layer insulating layers 124 between the semiconductor layers 70 and the cell source line 115. The semiconductor layers 70 and the cell source line 115 are electrically connected.

Bit lines 129 are formed in the X-direction above the memory element strings 110b and the cell source line 115. The interlayer-insulating layers 124 are formed between the memory element strings 110b and the bit lines 129. The inter-layer insulating layers 124 are formed between the semiconductor layer 70 and the bit lines 129. Vias 128B filled with conductive layers 127B made of, for example, polysilicon, are formed in the inter-layer insulating layers 124. The semiconductor layers 70 and the bit lines 129 are electrically connected by the conductive layers 127B. Note that the inter-layer insulating layers 124 are also formed between the cell source line 115 and the bit lines 129.

As described above, the semiconductor memory device is includes the memory element strings 110a and 110b including a plurality of the memory elements 100a and 100b extending in the X-direction, arrayed spaced from one another in the Y-direction, and having the semiconductor layers 70 in common. Therefore, the semiconductor memory device 1a is a lateral-type stacked memory device.

As shown in FIG. 30, the semiconductor memory device is according to the embodiment includes a memory cell 2a including the memory element strings 110a and 110b and the control unit 3. The memory cell 2a includes the memory element strings 110a and 110b arrayed in a matrix shape. The memory elements 100a and 100b are three-dimensionally disposed on the memory cell 2a. As the control unit 3a, the control unit same as the control unit 3 of the semiconductor memory device 1 in the first embodiment can be used. Like the semiconductor memory device 1 according to the first embodiment, the semiconductor memory device ha, which is the lateral-type stacked memory device, includes the memory elements having the semiconductor layers 70, which form channels, in common. Therefore, an applied bias state of the memory elements 100a on one side affects a threshold voltage of the memory elements on the other side. Therefore, as in the semiconductor memory device 1 according to the first embodiment, a voltage applied to the bit line 129, the cell source line 115, and a word line 139 is selected according to the write mode, the readout mode, and the erase mode using the control unit 3a.

As described above, in the semiconductor memory device is of the embodiment, insulating layers that separate the memory element strings 110a and 110b are unnecessary. It is possible to improve a bit integration degree. Since a process forming the insulting layer is unnecessary, a manufacturing process is reduced and a throughput of manufacturing is improved.

As described above, by respectively appropriately setting voltages applied to the control gate electrode films 21 of the memory elements disposed to be opposed to each other across the silicon pillar 20, it is possible to use the silicon pillar 20 in common between the two memory elements 30. Therefore, regions that separate the silicon pillars belonging to the respective memory elements are unnecessary. It is possible to improve the bit integration degree. Since a process for separating the silicon pillars is unnecessary, manufacturing is facilitated.

What is claimed is:
1. An operation method for a memory device including:
a first memory element provided on a first side of a semiconductor member, the first memory element having a first word line extending in a first direction and a first charge storage layer, the semiconductor member extending to a second direction, the first side of the semiconductor member being along the second direction;
a second memory element provided on a second side of the semiconductor member, the second memory element having a second word line extending in the first direction and a second charge storage layer, the second side being opposed on the first side with the semiconductor member in a third direction crossing the first direction and the second direction parallel to the sub- strate, the first memory element and the second memory element formed in common with the semiconductor member; and a bit line extending in the third direction, an end of the first side being electrically connected to the bit line, an end of the second side being electrically connected to the bit line, the operation method comprising:

when writing a first data to the first memory element, applying a first potential on the second word line to write a second data to the second memory element, the first potential increasing by a first step voltage; and applying a second potential on the first word line to write the first data to the first memory element, the second potential increasing by a second step voltage.

2. The method according to claim 1, wherein the first step voltage is larger than the second step voltage.

3. The method according to claim 2, wherein the first potential is not less than 0 V, and the applying the first potential increasing by the first step voltage includes:

after applying the first potential to write the second data to the second memory element;

applying a third potential on the second word line to read out the second data; and applying a potential generated by adding the first step voltage to the first potential on the second word line.

4. The method according to claim 1, wherein the memory device further includes:

a third memory element provided on the first side of the semiconductor member, the third memory element having a third word line extending in the first direction and a third charge storage layer, the third memory element being provided adjacent to the first memory element in the second direction; and the method further comprising:

applying the first potential on the third word line to write a third data to the third memory element before writing the first data to the first memory element.

5. The method according to claim 1, further comprising, when writing a data to the second memory element, applying the second potential on the second word line to write the data after writing the first data to the first memory element.

6. A memory device comprising:

a substrate;

a first memory element provided on a first side of a semiconductor member, the first memory element having a first word line extending in a first direction and a first charge storage layer, the first charge storage layer being provided between the first word line and the semiconductor member, the semiconductor member extending to a second direction crossing the first direction, the first side of the semiconductor member being along the second direction;

a second memory element on a second side of the semiconductor member, the second memory element having a second word line extending in the first direction and a second charge storage layer, the charge storage layer being provided between the second word line and the semiconductor member, the second side being opposed on the first side in the third direction crossing the first direction and second direction parallel to the substrate with the semiconductor member, the first memory element and the second memory element formed in common with the semiconductor member;

a bit line extending in the third direction, an end of the first side being electrically connected to the bit line, an end of the second side being electrically connected to the bit line; and a control unit configured to, when writing a first data to the first memory element, apply a first potential on the second word line to write a second data to the second memory element, the first potential increasing by a first step voltage, and apply a second potential on the first word line to write the first data to the first memory element, the second potential increasing by a second step voltage.

7. The device according to claim 6, wherein the first step voltage is larger than the second step voltage.

8. The device according to claim 7, wherein the first potential is not less than 0 V, and the control unit is configured to apply a third potential on the second word line to read out the second data and apply a potential generated by adding the first step voltage to the first potential on the second word line after the control unit applies the first potential to write the second data to the second memory element.

9. The device according to claim 6, further comprising:

a third memory element provided on the first side of the semiconductor member, the third memory element having a third word line extending in the first direction and a third charge storage layer, the third storage layer being provided between the third word line and the semiconductor member, the third memory element being provided adjacent to the first memory element in the second direction; and the control unit being configured to apply the first potential on the third word line to write a third data to the third memory element before writing the first data to the first memory element.

10. The device according to claim 9, wherein, when writing a data to the second memory element, the control unit is configured to apply the second potential on the second word line to write the data after writing the first data to the first memory element.

11. A memory device comprising:

a first memory element provided on a first side of a semiconductor member, the first memory element including a first charge storage layer provide between a first electrode and the first side of the semiconductor member, the semiconductor member extending to a first direction, the first side of the semiconductor member being along the first direction;

a second memory element on a second side of the semiconductor member, the second memory element including a second charge storage layer provided between a second electrode and the second side of the semiconductor member, the second side being opposed on the first side with the semiconductor member, the first memory element and the second memory element formed in common with the semiconductor member;

a bit line extending in the second direction, an end of the first side being electrically connected to the bit line, an end of the second side being electrically connected to the bit line; and a control unit configured to, when writing a first data to the first memory element, apply a first potential on the second electrode to write a second data to the second memory element, the first potential increasing by a first step voltage, before applying a second potential on the first electrode to write the first data to the first memory element, the second potential increasing by a second step voltage.

12. The device according to claim 11, wherein the first step voltage is larger than the second step voltage.

13. The device according to claim 12, wherein
the first potential is not less than 0 V, and
the control unit is configured to apply a third potential on the second electrode to read out the second data and apply a potential generated by adding the first step voltage to the first potential on the second electrode after the control unit applies the first potential to write the second data to the second memory element.

14. The device according to claim 11, further comprising:
a third memory element provided on the first side of the semiconductor member, the third memory element including a third charge storage layer provided between a third electrode and the first side of the semiconductor member, the third memory element being provided adjacent to the first memory element and provided in series with the first memory element,
the control unit being configured to apply the first potential on the third electrode to write a third data to the third memory element before writing the first data to the first memory element when writing a first data to the first memory element.

15. The device according to claim 14, wherein, when writing a data to the second memory element, the control unit is configured to apply the second potential on the second electrode to write the data after writing the first data to the first memory element.

16. The device according to claim 11, further comprising:
a first transistor provide on the first side of the semiconductor member and provided in series with the first memory element; and
a second transistor provided on the second side of the semiconductor member and provided in series with the second memory element,
the control unit being configured to turn on the first transistor and turn off the second transistor
when writing the data to the first memory element.

17. The device according to claim 11, wherein the first charge storage layer and the second charge storage layer include silicon.

18. The device according to claim 11, wherein the first electrode and the second electrode include silicon.

19. The device according to claim 1, wherein another end of the first side is connected to a source line and another end of the second side is connected to the source line.

* * * * *